(12) United States Patent
Bhat et al.

(10) Patent No.: US 6,885,035 B2
(45) Date of Patent: Apr. 26, 2005

(54) MULTI-CHIP SEMICONDUCTOR LED ASSEMBLY

(75) Inventors: Jerome C. Bhat, San Jose, CA (US); Daniel A. Steigerwald, Cupertino, CA (US); Reena Khare, Sunnyvale, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/859,154

(22) Filed: May 15, 2001

(65) Prior Publication Data

US 2001/0032985 A1 Oct. 25, 2001

Related U.S. Application Data

(63) Continuation-in-part of application No. 09/469,657, filed on Dec. 22, 1999, now Pat. No. 6,486,499.

(51) Int. Cl.[7] .......................... H01L 27/15; H01L 29/20
(52) U.S. Cl. ............................ 257/99; 257/79; 257/81; 257/88; 257/103
(58) Field of Search .............................. 257/79–82, 84, 257/85, 88, 99, 103

(56) References Cited

U.S. PATENT DOCUMENTS

| | | | | |
|---|---|---|---|---|
| 3,593,070 A | * | 7/1971 | Reed | 257/735 |
| 3,813,587 A | | 5/1974 | Umeda et al. | 317/235 |
| 3,947,840 A | * | 3/1976 | Craford et al. | 257/88 |
| 4,165,474 A | * | 8/1979 | Myers | 313/500 |
| 4,238,707 A | | 12/1980 | Malissin et al. | 315/175 |
| 4,329,625 A | | 5/1982 | Nishizawa et al. | 315/158 |
| 4,423,478 A | | 12/1983 | Bullock et al. | 363/89 |
| 4,983,884 A | | 1/1991 | Wychulis | 315/151 |
| 5,362,977 A | | 11/1994 | Hunt et al. | 257/98 |
| 5,408,120 A | | 4/1995 | Manabe et al. | 257/431 |

(Continued)

FOREIGN PATENT DOCUMENTS

| | | | |
|---|---|---|---|
| DE | 197 56856 A1 | 12/1997 | |
| DE | 199 21 987 A1 | 11/1999 | ........... H01L/33/00 |
| EP | 0 550 963 A1 | 7/1993 | |
| EP | 0 702414 A2 | 3/1996 | |
| EP | 0 772 249 A2 | 5/1997 | |
| EP | 0 772 249 A3 | 11/1998 | |
| EP | 0921577 A1 | 6/1999 | ........... H01L/33/00 |
| EP | 0 926 744 A2 | 6/1999 | ........... H01L/33/00 |
| EP | 926 744 A3 | 5/2000 | ........... H01L/33/00 |
| EP | 1 020 935 A2 | 7/2000 | ........... H01L/33/00 |
| EP | 030 377 A2 | 8/2000 | |
| GB | 2301934 | 12/1996 | |
| GB | 2 343 994 | 5/2000 | ........... H01L/33/00 |
| JP | 0 529 1621 | 11/1993 | |
| JP | 7235624 | 9/1995 | ........... H01L/23/48 |
| JP | 11 150 297 | 6/1999 | |
| JP | 11 191 641 | 7/1999 | |
| JP | 11 274568 | 10/1999 | ........... H01L/33/00 |

OTHER PUBLICATIONS

Roger Maxwell, "LED or Lamp Flasher: Minimum parts counting Designed for 3V battery operation", http:/www.ee-.washington.edu/circuit_archive/circuits.

(Continued)

Primary Examiner—Nathan J. Flynn
Assistant Examiner—Johannes Mondt
(74) Attorney, Agent, or Firm—Patent Law Group LLP

(57) ABSTRACT

A light emitting device includes several LEDs, mounted on a shared submount, and coupled to circuitry formed on the submount. The LEDs can be of the III-Nitride type. The architecture of the LEDs can be either inverted, or non-inverted. Inverted LEDs offer improved light generation. The LEDs may emit light of the same wavelength or different wavelengths. The circuitry can couple the LEDs in a combination of series and parallel, and can be switchable between various configurations. Other circuitry can include photosensitive devices for feedback and control of the intensity of the emitted light, or an oscillator, strobing the LEDs.

36 Claims, 34 Drawing Sheets

U.S. PATENT DOCUMENTS

| | | | | |
|---|---|---|---|---|
| 5,410,159 | A | | 4/1995 | Sugawara et al. ............ 257/13 |
| 5,461,425 | A | | 10/1995 | Fowler et al. ............... 348/294 |
| 5,475,241 | A | * | 12/1995 | Harrah et al. .................. 257/99 |
| 5,557,115 | A | | 9/1996 | Shakuda ....................... 257/81 |
| 5,563,422 | A | | 10/1996 | Nakamura et al. ............ 257/13 |
| 5,621,225 | A | * | 4/1997 | Shieh et al. ................... 257/81 |
| 5,744,829 | A | | 4/1998 | Murasato et al. ............. 257/94 |
| 5,862,167 | A | | 1/1999 | Sassa et al. ................... 372/45 |
| 5,886,401 | A | | 3/1999 | Liu ............................. 257/678 |
| 5,914,501 | A | | 6/1999 | Antle et al. .................... 257/99 |
| 5,955,747 | A | * | 9/1999 | Ogihara et al. ............... 257/88 |
| 5,998,232 | A | | 12/1999 | Maruska ...................... 438/46 |
| 6,016,038 | A | | 1/2000 | Mueller et al. ............. 315/291 |
| RE36,747 | E | | 6/2000 | Manabe et al. ............. 257/431 |
| 6,081,540 | A | | 6/2000 | Nakatsu ....................... 372/45 |
| 6,091,085 | A | | 7/2000 | Lester .......................... 257/98 |
| 6,121,127 | A | | 9/2000 | Shibata et al. .............. 438/604 |
| 6,133,589 | A | | 10/2000 | Krames et al. ............. 257/103 |
| 6,150,774 | A | | 11/2000 | Mueller et al. ............. 315/291 |
| 6,169,294 | B1 | | 1/2001 | Biing-Jye et al. ............. 257/79 |
| 6,333,522 | B1 | * | 12/2001 | Inoue et al. ................... 257/99 |
| 6,384,429 | B1 | * | 5/2002 | Ogihara et al. ............... 257/88 |

OTHER PUBLICATIONS

G. J. Sun and K. H. Chae, "Properties of 2,3–butanedione and 1–phenyl–1,2–propanedione As New Photosensitizers For Visible Light Cured Dental Resin Composites", Polymer, vol. 41, pp. 6205–6212 (2000).

Evans et al., "Edge–Emitting Quantum Well Heterostructure Laser Diodes with Auxiliary Native–Oxide Vertical Cavity Confinement," *Applied Physics Letters*, 67(1995) Nov. 20, No. 21, pp. 3168–3170.

Han, H. et al.: "Electroplated Solder Joints for Optoelectronic Applications" Electronic Components & Technology, 1996, pp. 963–966, XP000646645.

"Barrier Layer in the metallisation of Semiconductor Diode Lasers" Research Disclosure, Kenneth Mason Publications, Hampshire, 1994, No. 360, p. 179, XP000446545, ISSN: 0374–4353.

Krames et al., "High–Power Truncated–Inverted–Pyramid (AlxGal-x) 0.5In0.5P/GaP Light–Emitting Diodes Exhibiting>50% External Quantum Efficiency", Applied Physics Letter, vol. 75, No. 16, Oct. 18, 1999, pp. 2365–2367.

Mensz, P.M. et al.: "$In_xGa_{1-x}N/Al_yGa_{1-y}N$ violet light emitting diodes with reflective p–contacts for high single sided light extraction" Electronics Letters, GB, IEE Stevenage, vol. 33, No. 24, Nov. 20, 1997, pp. 2066–2068, XP000734311, ISSN: 0013–5194.

Tan, Q. et al.: "Soldering technology for Optoelectronic Packaging" Electronic Components & Technology, 1996, pp. 26–36, XP000646646.

Sugawara, H. et al, "Emission Properties of InGaAlP, Visible Light–Emitting Diodes Employing a Multiquatum–Well Active Layer", Jpn. J. Appl. Phys., vol. 33 (1994) Pt. 1, No. 10, Oct. 1994, pp. 5784–5787.

Chang, S. J., et al, "AlGaInP multiquantum well light–emitting diodes", IEE Proc.–Optoelectron, vol. 144, No. 6, Dec. 1997, pp. 405–409.

Benisty, H., "Impact of Planar Microcavity Effects on Light Extraction–Part I: Basic Concepts and Analytical Trends", IEE Journal of Quantum Electronics, vol. 34, No. 9, Sep. 1998, pp. 1612–1631.

\* cited by examiner

MULTI-CHIP SEMICONDUCTOR LED ASSEMBLY

CROSS REFERENCE TO RELATED U.S. APPLICATIONS

This application is a Continuation-In-Part of U.S. application Ser. No. 09/469,657, filed Dec. 22, 1999 now U.S. Pat. No. 6,486,499, entitled "III-Nitride Light-Emiting Device With Increased Light Generating Capability", by Michael R. Krames, Daniel A. Steigerwald, Fred A. Kish Jr., Pradeep Rajkomar, Jonathan J. Wierer Jr., and Tun S. Tan, incorporated herein by reference.

BACKGROUND

1. Field of Invention

The present invention relates to semiconductor light emitting devices, and more particularly, to multiple light emitting devices mounted on a shared submount.

2. Discussion of Related Art

It is known to control light emitting diodes (LEDs) to, for example, generate various colors, control on/off timing, or control brightness levels. In devices, which include LEDs with the three primary colors—red (R), green (G), blue (B)—varying the current of the three LEDs enables the generation of almost any color in the visible spectrum. Therefore, they are prime candidates to be used in, for example, color displays. Furthermore, of particular interest are devices capable of generating white light (consisting of R, G, and B components) because of their potential for replacing conventional light sources, such as light bulbs.

Related progress includes the following works. Mueller et al in U.S. Pat. Nos. 6,016,038 and 6,150,774 disclose a pulse width modulated current control for an LED lighting assembly, where each current-controlled unit is uniquely addressable and capable of receiving illumination color information on a computer network. The LEDs are controlled by a microprocessor to alter the brightness or the color of the generated light, for example by using pulse width modulated signals. This LED assembly is therefore capable of providing complex, predesigned patterns of light. However, the LEDs are packaged individually, and the driving logic is positioned separately from the LEDs, resulting in spatially extensive structures.

Mizutani et al. in Japanese patent JP7235624 disclose an LED lamp, wherein a package is formed of transparent resin, and the electrodes of an inverted LED device are bonded directly on the conducting pathways, leading outside the package. However this approach relies on the creation of several individual wire bonds, and thus does not eliminate the number one source of failure of LED systems, the breakdown of the wire bonds.

Finally, Liu et al. in U.S. Pat. No. 5,886,401 disclose an LED interconnection package, wherein the LED is situated on a substantially transparent substrate, having a contact surface with contact pads; a polymer film overlying the contact surface and having via openings; a substantially transparent support surrounding the LED and the substrate; and metallization overlying the polymer film and extending through the via openings for interconnecting the contact pads. An array of the disclosed LEDs mounted on a shared submount is then described. However, a switch circuit for controlling the LEDs is positioned outside the LED package, once again resulting in spatially extensive structures.

There are areas where marked improvement is desired. A higher density LED architecture is desired for space considerations, such as in applications where LED devices are integrated with other circuit elements, for example, on circuit boards. Higher densities are also advantageous to construct high power applications. Higher densities allow the creation of smaller LED assemblies, which resemble more closely an ideal point source of light; thus, the secondary optics, manipulating the emitted light, are simpler and cheaper to produce.

SUMMARY

In accordance with the present invention several LEDs are mounted on a shared submount and connected by circuitry on the submount. The submount is preferably silicon, having metal traces and possibly logic circuitry formed directly on/in the submount by integrated circuit fabrication techniques.

Some embodiments of the invention utilize compound semiconductor LEDs produced from column III elements of the periodic table, such as Al, Ga, or In and column V elements, such as N or P. All the contact pads are on the same side of these devices. This inverted architecture is often called flip-chip design. The device is mounted on a submount by, for example, soldering the contact pads to circuitry formed in the submount. In this architecture, the transparent substrates of the LED devices are directed away from the submount, enabling the unobstructed escape of the generated light through the substrate. Some embodiments may have the substrate removed. These inverted designs make possible enhanced light extraction compared to the standard wire-bond design. Connecting the LEDs to metallic traces on the shared submount reduces the number one cause of failure of circuitry: the breakdown of the wire bonds.

In some embodiments, the circuitry on the submount connects the LEDs in parallel, in series, or in a combination of parallel and series. Connecting LEDs in series offers an improved utility, because typical operating voltages for an AlInGaN LED are in the 2.4–4 V regime, whereas, in many applications the driving circuitry operates at a different voltage. For example, in an automobile, a 12 V battery is driving the circuit. Constructing a device, which connects 3 or 4 LEDs in series, operates all LEDs in the required voltage range, while driven by the standard 12 V automobile battery.

Some embodiments may include a switch, which is capable of switching the coupling of the LEDs between series and parallel. The utility of this architecture is that a change of the circuitry can adjust the device to operating at different input voltages.

Some embodiments include LEDs on the same submount emitting a variety of wavelengths. Embodiments including LEDs of the three primary colors—red, green, blue—are capable of emitting white light, with possible applications of replacing regular incandescent light bulbs. Such color LEDs may also be used in color displays. Embodiments including LEDs capable of emitting, for example, ultraviolet and blue light with wavelengths of 420 nanometers and 470 nanometers find useful application in dentistry, where they are used to cure certain materials used for fillings.

In some embodiments the circuitry formed in the submount includes a diode, operated in the reverse direction to the LED. This architecture offers good Transient Voltage Suppression (TVS) and thus defense against Electrostatic Discharge (ESD), a leading cause of circuit failure for III-nitride materials.

In some embodiments, the submount includes a photosensitive device that receives a portion of the emitted light and a control unit. The photosensitive device measures the intensity of the emitted light. If the intensity is found to deviate from a nominal value, the control unit adjusts the current to the LEDs. This embodiment addresses the problem that LEDs exhibit a marked decline in intensity of the emitted light with time, leading, for example, to an undesired shift of chromaticity in color display applications, or falling out of the prescribed intensity range in, for example, traffic light applications.

BRIEF DESCRIPTION OF DRAWINGS

FIG. 17a shows a plan view of the structure. FIG. 17b shows the corresponding schematic diagram.

DETAILED DESCRIPTION OF THE EMBODIMENT

First, a detailed description of an inverted III-Nitride LED and a submount for one or more LEDs is provided, which corresponds to the disclosure in the parent application. In the second part of this application additional embodiments are described in detail, utilizing several inverted III–V LEDs mounted on a shared submount.

The Inverted III-Nitride LED

One fundamental limiting condition of LED operation is maximum junction temperature. The maximum junction temperature, $T_{jmax}$, is the temperature of the p-n junction region at which breakdown or failure occurs in some part of the LED or its housing. This breakdown often occurs as the glass transition temperature of an encapsulating epoxy or lens is approached, causing loss of transparency and eventual melting of these materials. With such a limit established, $\Delta T_j$, the temperature rise from ambient to $T_{jmax}$, may be expressed as (assuming power conversion efficiency <<100% which is true for present-day III-nitride devices), $$\Delta T_j = T_{jmax} - T_a = I_{max} V_f \Theta_{j-a}, \qquad (1)$$

where $T_a$ is the ambient temperature, $I_{max}$ is the maximum operating current, and $V_f$ is the forward voltage at that current, and $\Theta_{j-a}$ is the thermal resistance from the p-n junction to ambient. Inserting a simplified expression for $V_f$, and re-writing yields $$I_{max} = \Delta T_j / [\Theta_{j-a}(V_0 + I_{max} R_s)], \qquad (2)$$

where $V_0$ is the turn-on voltage (approximately the III-nitride semiconductor bandgap voltage) and $R_s$ is the electrical series resistance of the device. Solving for $I_{max}$ yields $$I_{max} = [\Delta T_j/(R_s \Theta_{j-a}) + (\tfrac{1}{2} V_0/R_s)^2]^{1/2} - \tfrac{1}{2} V_0/R_s \qquad (3)$$

Figure 3:
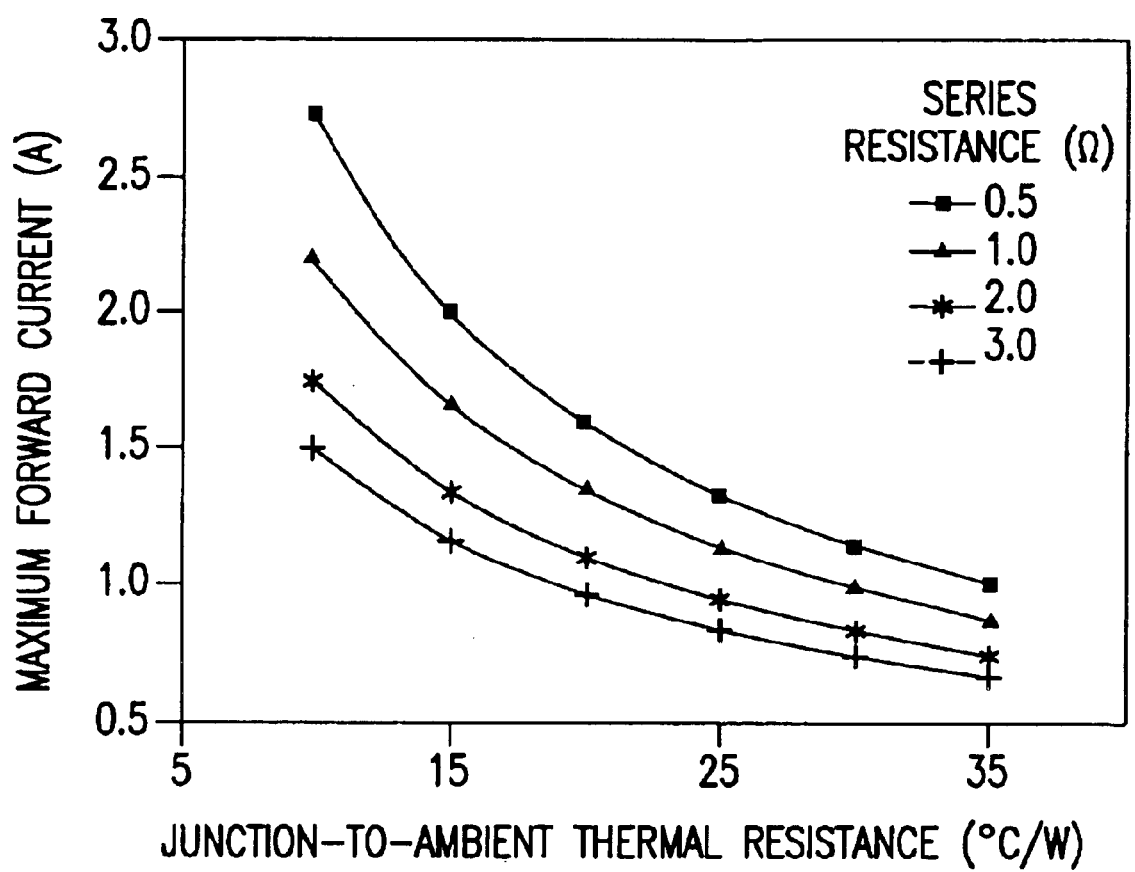
FIG. 3 shows maximum forward current as a function of the junction-to-ambient thermal resistance.

Equation 3 is plotted in FIG. 3 for the case of $V_0$=2.5 V (corresponding to an energy bandgap of wavelength, λ~500 nm) and $T_{jmax}$=130° C. for varying values of $R_s$ and $\Theta_{j-a}$. The range of values of these parameters is consistent with die dimensions of ~1 mm² and with systems that are well designed for heat removal. The rank in importance between $R_s$ and $\Theta_{j-a}$ is determined by what portion of the graph in FIG. 3 is governing the application. However, in most cases in FIG. 3, a ~5° C./W reduction in thermal resistance more efficiently increases $I_{max}$ (and thus light output) than a ~0.5 Ω drop in series resistance. Because series resistance derives from finite contact resistances and practical doping levels, it is difficult to reduce to arbitrarily low levels. Thus, it is clear that thermal resistance is a significant lever arm for increasing $I_{max}$ and that it must be minimized to maximize light generating capability.

With $I_{max}$ fixed by the limitation on junction temperature, the maximum light generating capability is described in Equation 4:

$$L_{max} = \eta I_{max} \quad (4)$$

where $L_{max}$ is the maximum light output in Watts and $\eta$ is the slope efficiency of the LED in W/A. The slope efficiency is proportional to the external quantum efficiency, such that $$\eta \sim \eta_{ext} = \eta_{int} C_{ext}, \quad (5)$$

where $\eta_{int}$ is the internal quantum efficiency and $C_{ext}$ is the light extraction efficiency of the LED. Thus, with a fixed active region efficiency ($\eta_{int}$), maximum light generating capability is obtained by maximizing extraction efficiency.

Since both series resistance and thermal resistance of the LED die are inversely proportional to junction area, it is desirable to increase the die size to increase $I_{max}$. Scaling up the die geometry arbitrarily runs into practical limitations of primary and secondary optics sizes and power dissipation capability of the LED package within a lighting system. Instead, the die size should be chosen to make efficient use of the allowable power dissipation provided by the LED package. In typical systems, junction-to-ambient thermal resistances are approximately ~60° C./W, as described in Hofler et.al., Electronics Letters 34, 1 (1998). A quick calculation puts an upper limit on the power dissipation of the LED package. Assuming an ambient temperature of 40° C. and a $T_{jmax}$ of 130° C., the maximum input power is (130 −40)/60=1. The maximum input power may be written $$P_{max} = I_{max} V_f = I_f(V_0 + I_{max} R_s) = J_{max}(V_0 + J_{max} \rho_s) A_{die}, \quad (6)$$

where $J_{max}$ is the maximum forward current density in A/cm², $\rho_s$ is the die series resistivity in Ω-cm², and $A_{die}$ is the die area (in cm²). For efficient and cost-effective operation, reasonably high forward current densities are required. A suitable forward current density is 50 A/cm . For 350×350 µm² devices, a typical series resistance is ~30 Ω, corresponding to a device resistivity on the order of $\rho_s$~4× $10^{-2}$ Ωcm². Assuming this same resistivity for Eqn. 6, with $J_{max}$=50 A/cm², and a $V_0$=2.5 V (corresponding to an energy bandgap of wavelength, λ~500 nm), the required die area to achieve the maximum input power allowed by the package is $6.7 \times 10^{-3}$ cm², or ~800×800 µm². Smaller devices at this same power level would result in increasing forward voltages and thus lower efficiency for the same current. Likewise, smaller devices would run at higher temperatures because of increased die thermal resistance.

Because of the high resistivity of p-type III-nitride layers, LED designs employ metallization along the p-type layers to provide p-side current spreading. Therefore, because of the insulating substrate, the n-side current spreading must occur through the n-type III-nitride layers. These layers are typically ~2 µm thick with resistivities of ~$10^{-3}$ Ω-cm. To account for the negligible portion of a typical device resistivity, the distance required for current spreading by the n-type layers should be kept less than ~200 µm. Therefore, a device larger than 400×400 µm² requires multiple n-electrode fingers interposing the p-electrode to keep device series resistance low. As shown above, devices for high light generating capability must be large, e.g. >400× 400 µm². Therefore, these devices should employ an interposing n-electrode design. This design has serious implications for an inverted structure since the n and p electrodes must be kept electrically isolated in connection to a submount.

For an inverted design, using highly reflective electrode metallizations is critical to improve the extraction efficiency.

Figure 4:
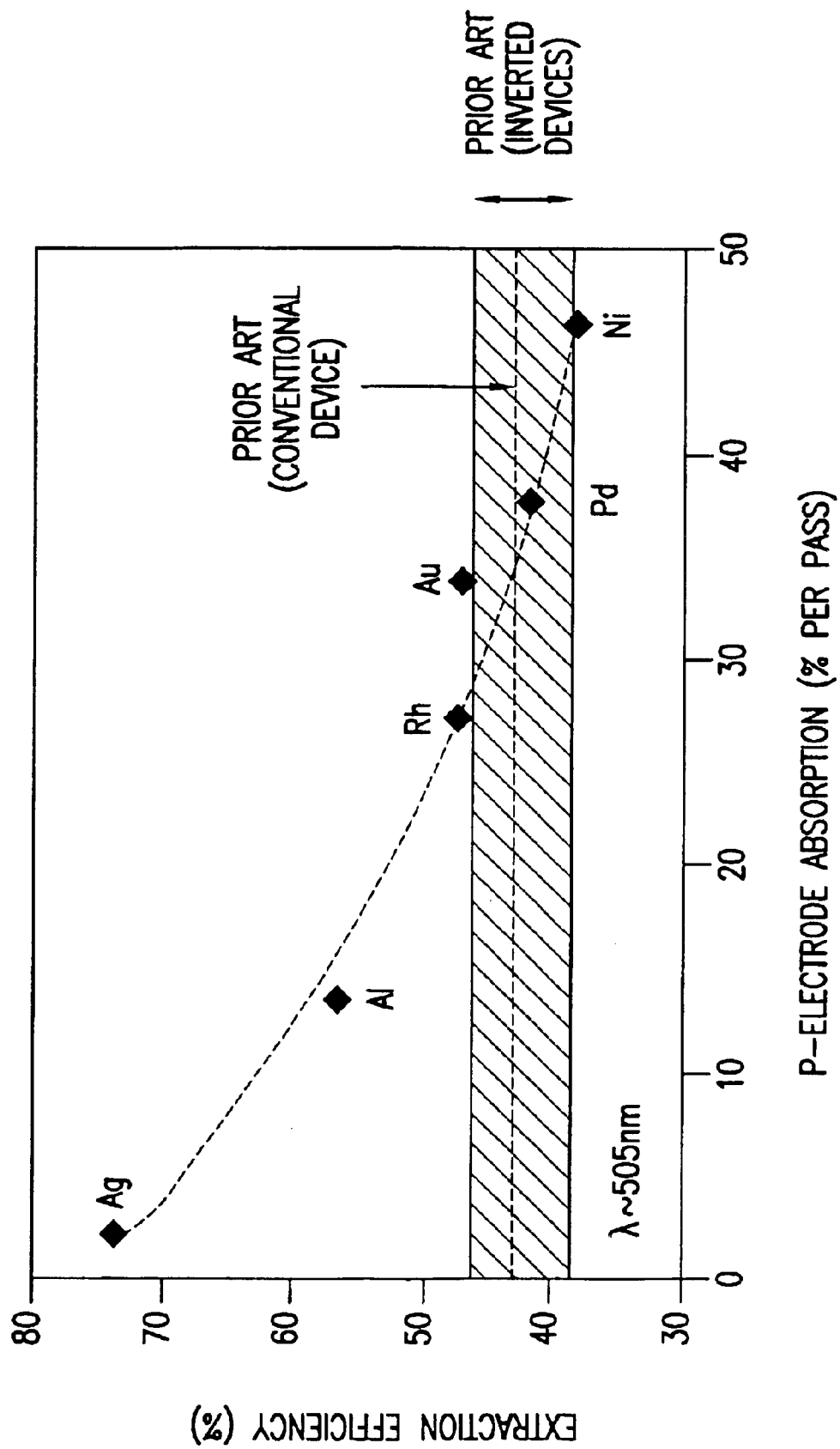
FIG. 4 shows LED extraction efficiency as a function of p-electrode absorption.
Figure 5:
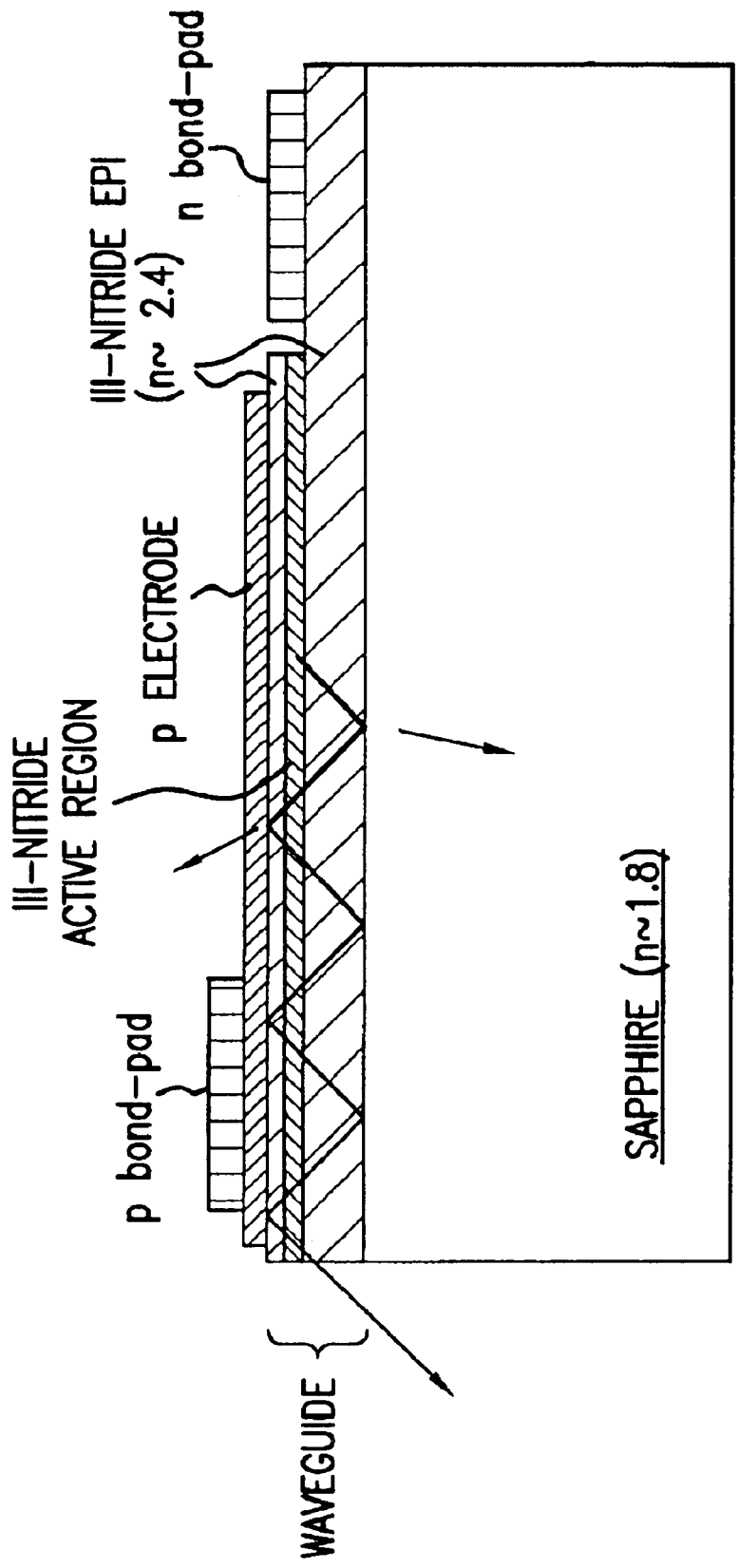
FIG. 5 shows light trapped in a prior art light-emitting device.

FIG. 4 shows LED extraction efficiency vs. p-electrode absorption for an inverted die design in comparison with the conventional (epitaxy-side up) device. The extraction efficiencies plotted in FIG. 4 are determined by optical ray-trace modeling of LED die structures (1×1 mm²) and include measured optical properties of all the LED materials. All of the inverted devices that were modeled employ sapphire superstrates, while the conventional devices (not inverted) use sapphire substrates. The p-electrode absorption (x-axis) is defined as the percent of light absorbed per pass assuming illumination from an isotropic point source of light within the III-nitride epi layers adjacent to the p-electrode at the wavelength of interest. The p electrode is the dominant factor for light extraction because it extends almost completely across the active area to provide uniform current injection into the p-n junction. Furthermore, the refractive index difference between the sapphire (n~1.8) and the III-nitride epitaxial layers (n~2.4) results in a large portion of the light generated from the active region being totally-internally-reflected at the sapphire/III-nitride interface. The amount of light trapped in this waveguide is ~cos((1.8/2.4)⁻¹)=66% of the total generated light, for isotropic emission from the active region. This light is trapped and guided laterally along the device towards the sides of the die, as illustrated in FIG. 5. While FIG. 5 shows a conventional (epitaxy-up) structure, the waveguiding effect is present whether the die is epitaxy-up or inverted. However, because of absorption by the p-electrode, most of the waveguided light is lost before escaping the device. For this reason, extraction efficiency is very sensitive to p-electrode absorption as shown by the data plotted in FIG. 4. This is especially significant in large-area, e.g. >400×400 µm², die since the number of passes at the p-electrode before escape is very large. The n electrode is also an optical loss mechanism, but is less significant because it covers less device area.

The ray-trace modeling results shown in FIG. 4 suggest that inverted die designs having Ni and/or Au electrodes provide extraction efficiencies from 38 to 47% (λ=505 nm). Conventional epitaxy-side-up devices with semi-transparent NiAu electrodes have an extraction efficiency of 43%. Hence, a Ni and/or Au p electrode in an inverted device does not provide significantly improved extraction efficiency relative to the conventional design. For an Ag p-electrode, however, the inverted die exhibits a ~1.7× gain in extraction efficiency over the conventional device. As shown explicitly in FIG. 4, to provide increased light extraction beyond a prior art device, the p electrode absorption in an inverted device should be less than 35%. Preferably, the p electrode absorption is less than 25%. While FIG. 4 is plotted for the case of 505 nm, the trend in extraction efficiency vs. p-electrode absorption is true regardless of wavelength. It is also important to point out that, while reflectivity is a prime consideration, so also is contact resistance. Poor contact resistance in the p electrode can result in a device with excessively high series resistance and thus reduced light generation capability as described by Equation 3. For 350× 350 µm² devices, a typical series resistance is ~30 Ω, corresponding to a device resistivity on the order of $4 \times 10^{-2}$ Ωcm². The p contact resistivity should be much less than this to minimize its contribution to the series resistance. In the present device, the p specific contact resistivity is preferably less than $10^{-2}$ Ωcm².

The combination of low optical absorption and low contact resistivity in a manufacturable process are difficult to achieve for III-nitride devices. For example, Ag makes a good p-type Ohmic contact and is very reflective, but suffers from poor adhesion to III-nitride layers and from susceptibility to electro-migration in humid environments which can lead to catastrophic device failure. Al is reasonably reflective but does not make good Ohmic contact to p-type III-nitride materials, while other elemental metals are fairly absorbing (>25% absorption per pass in the visible wavelength regime). A possible solution is to use a multi-layer contact which includes a very thin semitransparent Ohmic contact in conjunction with a thick reflective layer which acts as a current spreading layer. An optional barrier layer is included between the Ohmic layer and the reflective layer. One example of a p-type multi-layer contact is $Au/NiO_x/Al$. Typical thicknesses for this metallization scheme are 30/100/1500 Å. Similarly, a suitable n-type GaN multi-layer contact is Ti/Al with typical thicknesses of 30/1500 Å.

Since the p-electrode reflectivity is a dominant factor in extraction efficiency, it must not be compromised in designing for manufacturability. Even though on-wafer testing of inverted III-nitride LEDs is made difficult by the opaque sheet metallization, methods for such testing must not require degrading the reflective nature of the p electrode. For example, openings or semi-transparent regions inserted in the p electrode to allow light to escape upward during on-wafer testing only serve to degrade the efficiency of the finished device, by effectively reducing the p electrode reflectivity. Other methods that do not compromise the p-contact reflectivity should be used.

Figure 6A:
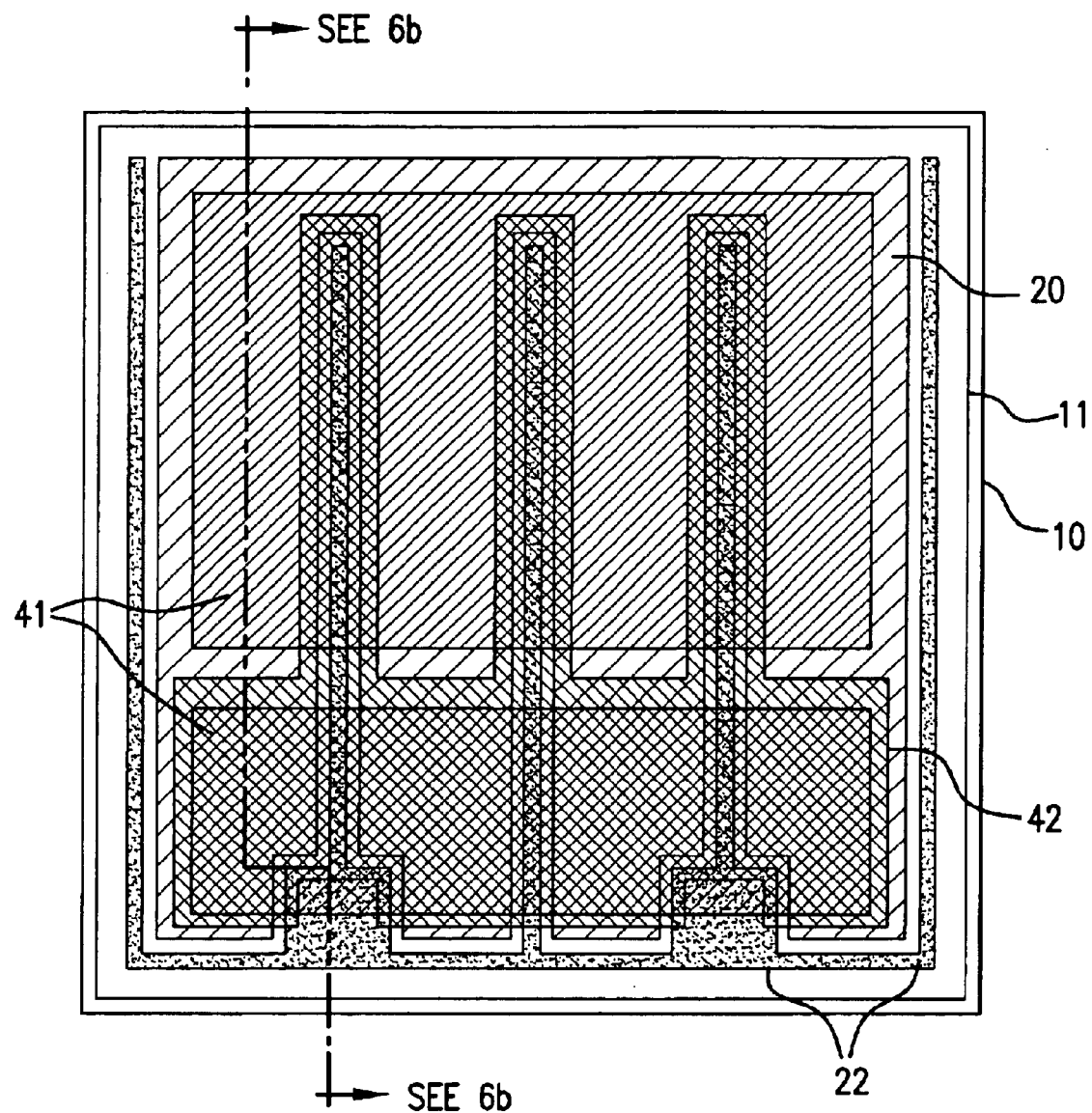
FIGS. 6a–b illustrate the plan and cross-sectional views of an LED, mounted on a submount, respectively.

The present disclosure describes a large-area, e.g. >400× 400 $\mu m^2$, high-power LED with maximum light generating capability by reducing the thermal resistance from the p-n junction to the lamp package while increasing light extraction. To accomplish this, the present device uses an inverted structure employing a low resistivity, opaque, highly reflective p-electrode. A first embodiment is shown in FIGS. 6a–b.

Figure 6B:
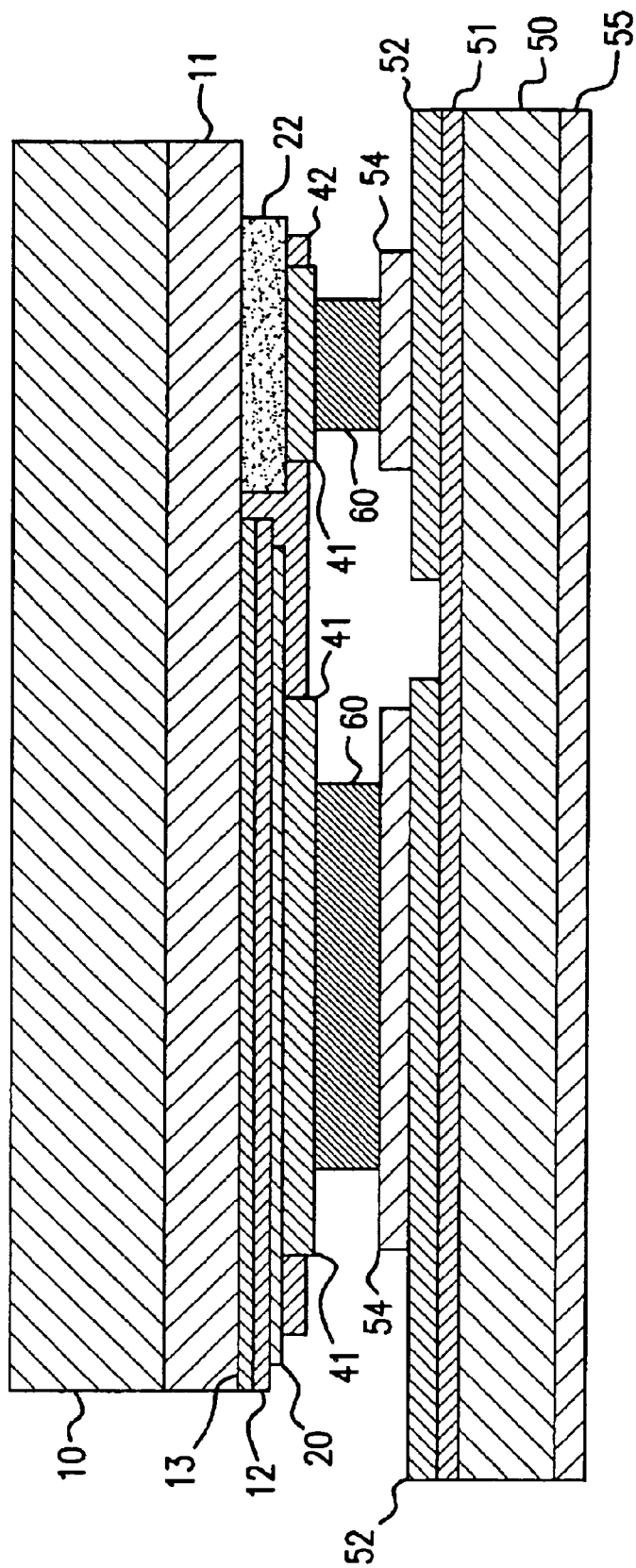

In the cross-sectional view shown in FIG. 6b, the device includes an III-nitride epitaxial heterostructure n-type and undoped layers 11 and p-type layers 12, each in contact with an active region 13. The III-nitride layers 11 are optionally attached to a transparent superstrate 10. The superstrate 10 can be the growth substrate for deposition of the III-nitride layers. In the plan view of the bottom of the LED die shown in FIG. 6a, the large area of the device (>400×400 $\mu m^2$) requires n-electrode 22 "fingers" interposing the p-electrode metallization 20 to spread current uniformly throughout the device. Such an electrode configuration is required in large-area devices to provide a low series resistance (to overcome the low conductivity III-nitride layers) and thus provide a high maximum drive current as specified in Equation 3. Thus, the interposed n-electrode configuration is required for large-area devices for maximizing total light generation capability. The device is inverted so that light may be taken out through the transparent superstrate 10 as well as the sidewalls and provides good extraction efficiency by using a highly reflective, thick p-electrode metallization 20. The reflectivity of the p-electrode is such that its absorption at the LED emission wavelength is less than 25% per pass, as described above. The electrode metallizations connect to submount electrodes 52 on a submount substrate 50 via interconnects 60. The interconnects make electrical connection between the LED and the submount while providing a thermal path for heat removal from the LED during operation. Although the illustrated embodiments refer to solder, the interconnects may be made of elemental metals, metal alloys, semiconductor-metal alloys, solders, thermally and electrically conductive pastes or compounds (e.g., epoxies), eutectic joints (e.g., Pd—In—Pd) between dissimilar metals between the LED die and submount, Au stud-bumps, or solder bumps.

The interconnects are attached to the LED and submount via conductive interfaces 41, 54. When solder is used as the interconnect, the conductive interfaces are wettable metals. An application process initially determines the interconnect thickness and area. One applicable technique is a screen-printing process where paste is applied to select areas on the submount wafer or LED. Other techniques include electro-plating, lift-off, and reflow. For an embodiment using solder as the interconnect, the final interconnect thickness and area are determined by the solder volume as well as the wettable metals 41 on the LED die and 54 on the submount. The solderable areas on the LED are defined through patterning of the wetting metals, or through vias in a patterned dielectric passivation layer 42 provided on the LED die. The dielectric passivation 42 layer acts as an electrical isolation layer between the p and n electrodes and is required since the solder layers 41 extend across both p and n electrodes. The solderable areas on the submount are similarly defined by patterning the solderable metals 54. In an alternate embodiment, the wettable areas of the metallization 54 may be defined by a patterned dielectric layer. A second set of solderable metal layers 55 may be deposited on the back of the submount for attachment to the package. Optionally, a suitable solder can be deposited directly on the back of the submount. Because the thermal conductivity of any underfill material between the LED and submount is very low, e.g. <2.0 W/mK, the junction-to-package thermal resistance is largely governed by the die/submount solder joint and the submount material and geometry. Assuming heat generation at the p-electrode metallization and one-dimensional flow and ignoring the thermal resistances of thin layers and the submount-package solder joint, the junction-to-package thermal resistance may be written as $$\Theta_{j\text{-}p} = (t_s/\rho_s + t_{sm}/\rho_{sm})/A_s, \text{ (dielectric ignored)} \tag{7}$$

where $t_s$ and $t_{sm}$ are the thicknesses, and $\rho_s$ and $\rho_{sm}$ are the thermal conductivities, of the solder and submount, respectively, and As is the total cross-sectional area of the solder. As shown in Equation 6, the solder area, As, controls thermal resistance. Hence, it is desirable to cover the entire surface of the LED die with the solder. This is not possible as electrical isolation is required between the p and n electrode regions of the LED. Also, the width of this gap between the n and p solderable metals must account for tolerances in die attaching to the submount. Even submount. Even so, the embodiment in FIG. 6a provides ~85% solder coverage (defined as the ratio of solderable metal area 41 relative to the p electrode area 20).

An alternate embodiment to that shown in FIGS. 6a–b includes a sheet reflector that comprises a portion of the p electrode 20 and extends beneath portions of the n electrode 22. An intermetal dielectric is formed between these regions of the n-electrode and the sheet reflector. The intermetal dielectric provides electrical isolation between the n and p electrodes in these regions. Other portions of the n electrode are not covered by the dielectric, to allow electrical connection to the submount. This embodiment reduces light leakage downward through gaps in the LED metallization, compared to the embodiment shown in FIGS. 6a–b, by reflecting this light upwards.

Figure 7:
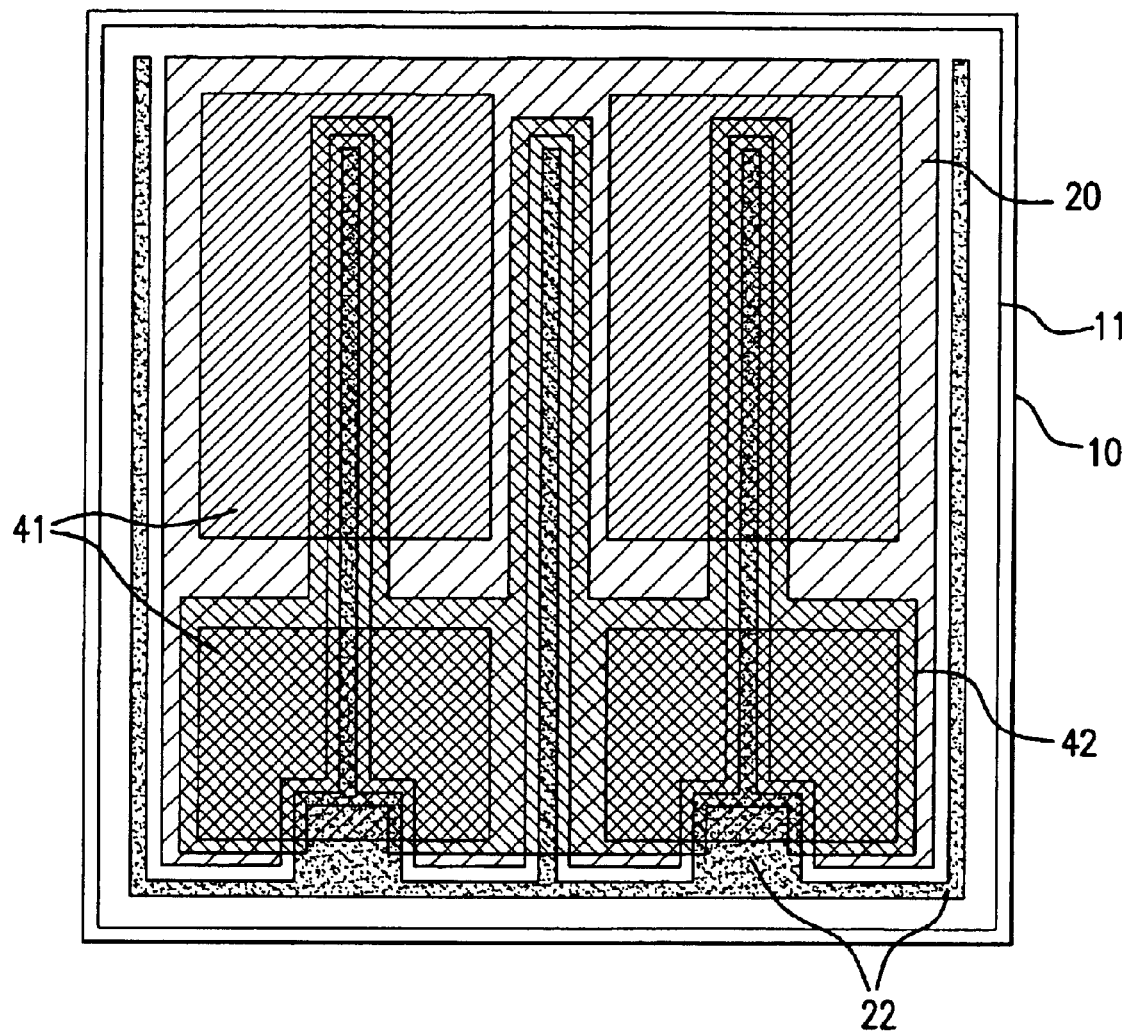
FIG. 7 illustrates the plan view of an LED, mounted on a submount.

The interconnect between the LED and submount is made when the solder is placed in a reflow oven at a temperature above the solid temperature of the solder alloy. During reflow, capillary forces and surface tension tend to align solderable metal areas to the solder sheets. This allows for some self-realignment of the LED die to the submount wafer. This self-realignment can be exploited through the use of a fast die-attach machine, allowing one to trade-off initial die-attach accuracy for speed. Further breaking up each p and n solder sheet into multiple sheets can improve self-realignment. In FIG. 7, the embodiment shows the p and n solder pads 41 in pairs. The gaps between the solder sheets are determined by the accuracy of the die-attach machine. The embodiment of FIG. 7 has superior self-realignment characteristics in the x and y directions while the embodiment of FIG. 6a has predominantly self-realignment characteristics in the y direction.

Figure 8:
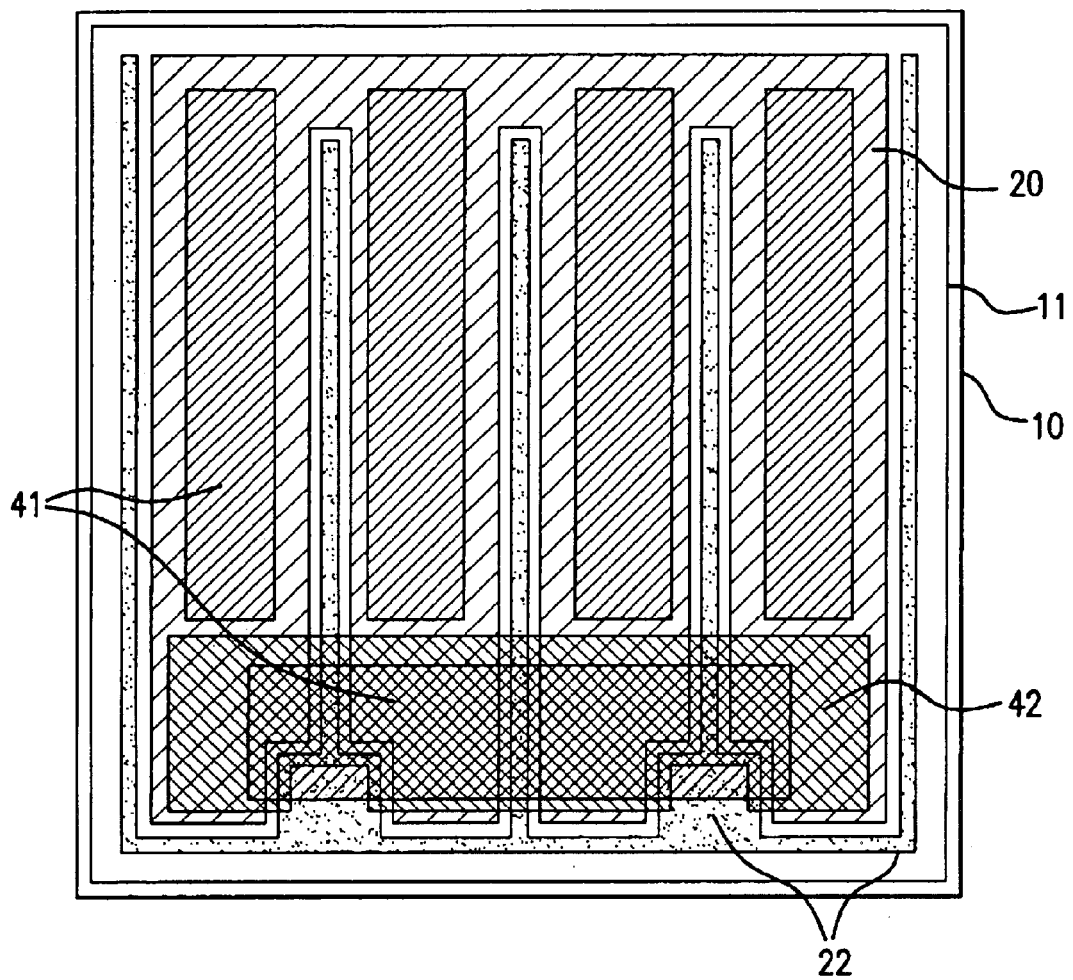
FIG. 8 illustrates the plan view of an LED, mounted on a submount.

In FIG. 8, the alternate embodiment shows the solderable metals 41 as solder "bars" of equal area. This design has the benefit of good self-realignment along with uniform wetting of the solderable metals during reflow. Uniform wetting occurs because the forces applied between the die and submount are proportional to the area of solder wetting. Uniform wetting is achieved by using a wettable metal pattern that consists of regions of equal area. Uniform wetting prevents the LED die from tilting during reflow and the subsequent cool-down. Maintaining a planar LED attach process means the LED die is less likely to undergo failure mechanisms, e.g. shorting of the p-n junction, which may emerge in the case where portions of the LED die are in close proximity to metallized areas on the submount. Also, the non-tilted LED die orientation provides improved light coupling to the other optical components in the LED lamp or system.

Figure 9:
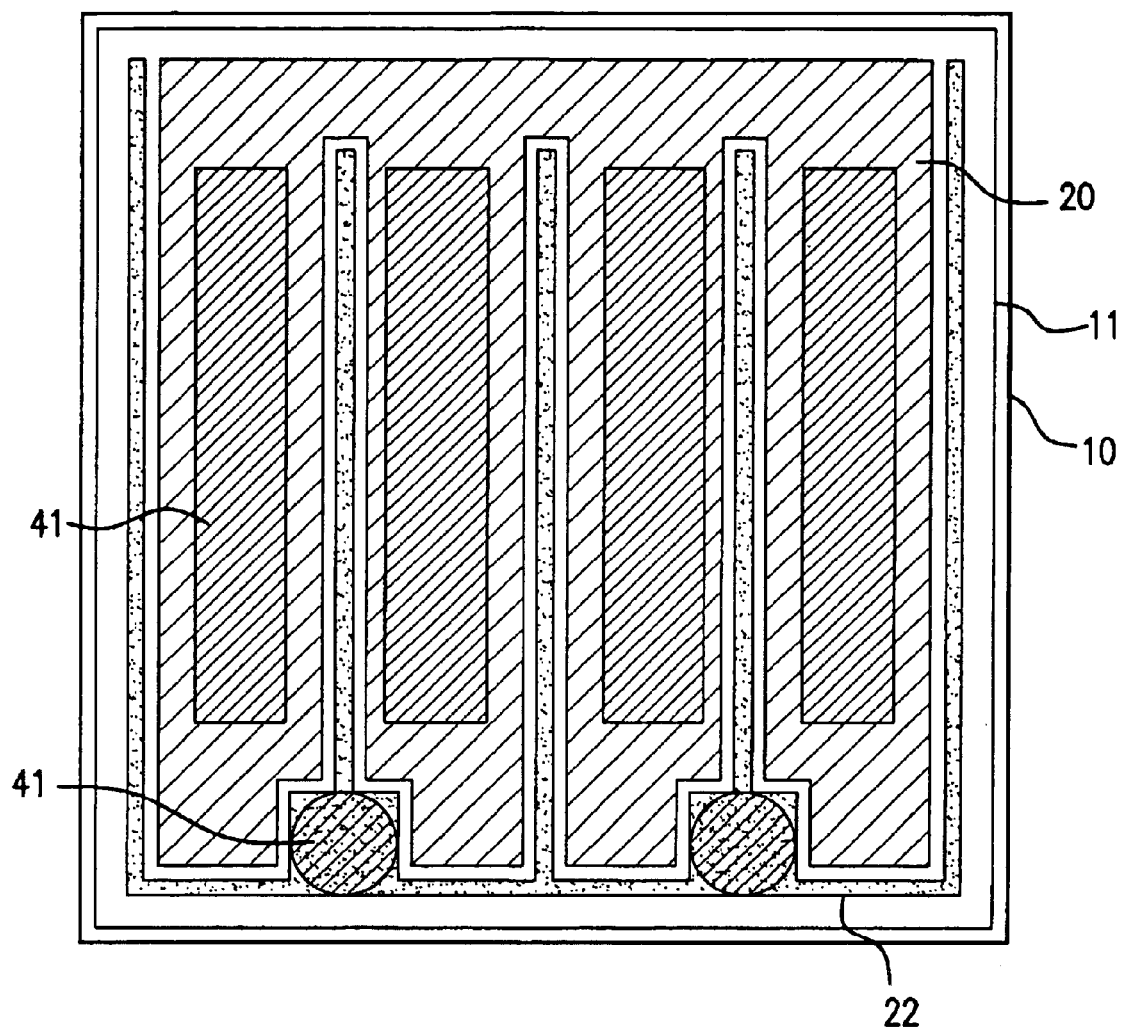
FIG. 9 illustrates the plan view of an LED, mounted on a submount.

In FIG. 9, another embodiment shows the n region solderable metal changed to pads for solder "bumps". The wafer fabrication process is simplified since isolation between the n and p electrodes are no longer required in the vicinity of the n solder pads hence eliminating the need for the dielectric passivation layer 42. The solder bump fabrication is an industry-standard practice, allowing solder connections at the n electrodes to be provided through well-established manufacturing techniques.

Figure 10A:
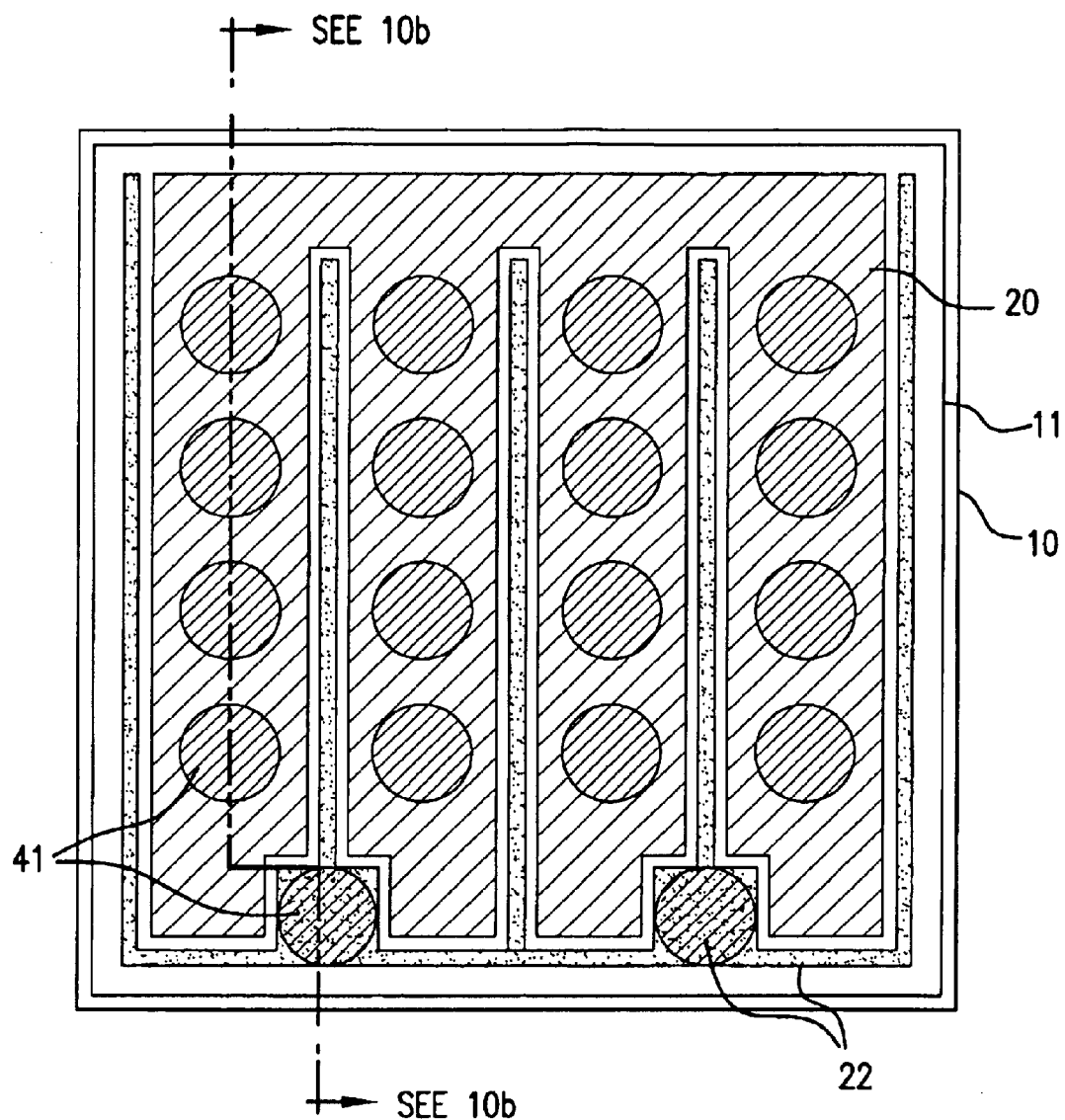
FIGS. 10a–b illustrate the plan and cross-sectional views of an LED, mounted on a submount, respectively.
Figure 10B:
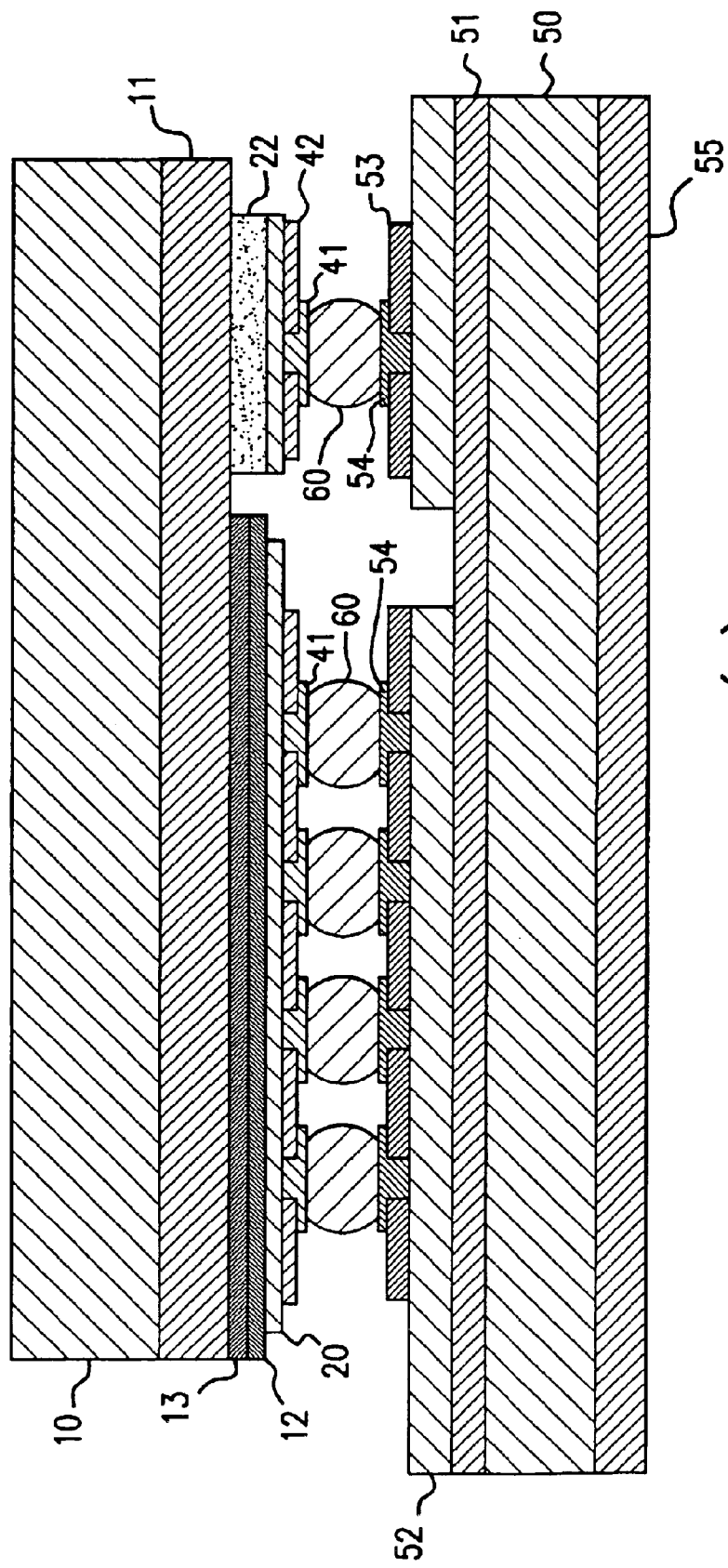
Figure 11A:
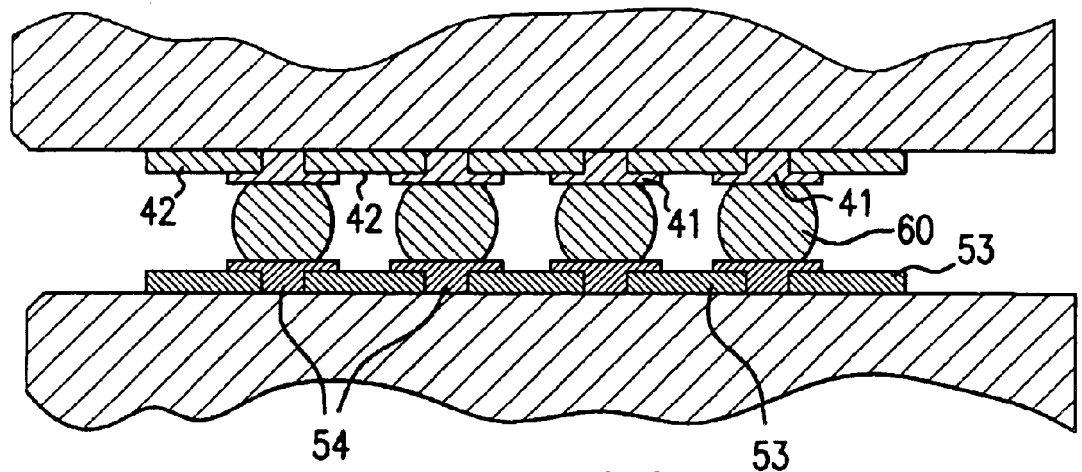
FIGS. 11a–b illustrate cross-sectional views of the embodiment shown in FIGS. 10a–b.
Figure 11B:
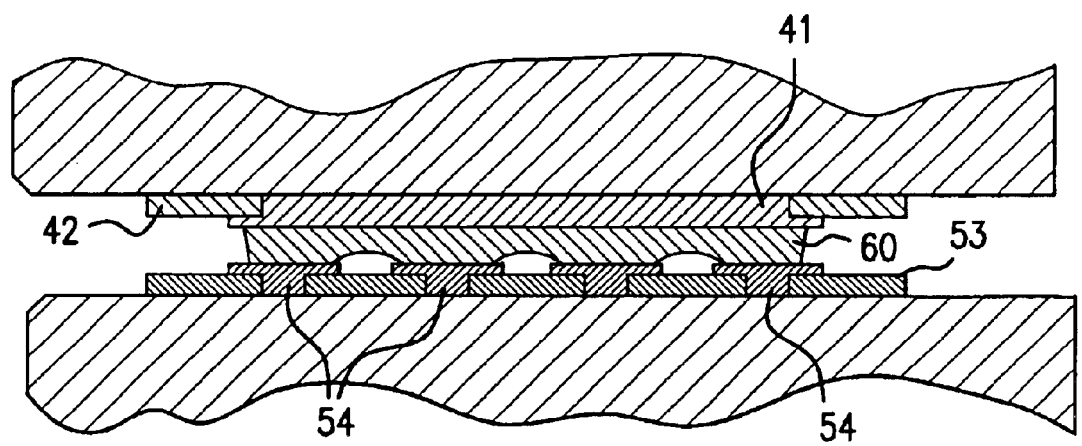

In an alternate embodiment, the plan and cross-sectional views shown in FIGS. 10a and 10b respectively, the entire solder attach interface is provided by solder pads for bumps. To minimize thermal resistance, the number of bumps is maximized to increase the final cross-sectional solder joint area, while minimizing the final solder thickness. The number of bumps is dictated by the state-of-the-art in solder bump formation which puts limits on solder-bump pitch for a given bump diameter. A typical pitch is 200 $\mu$m for 100 $\mu$m diameter bumps. For a 1 mm$^2$ die, five rows of 100 $\mu$m diameter bumps are feasible. In FIG. 10a, one row is two bumps for the n pads. The n-electrode fingers limit the number of bump rows along the p-electrode metallization to four. In this design, the solder area cross-section is maintained to be at least 15% of the area of the p-electrode. The solder area coverage may be increased by expanding the wettable metal surface area beyond the small vias required for individual bumps. For example, the wettable metal pattern on the LED die may consist of bars, shown in FIG. 8, while the solder bumps on the submount are still in the form of a 4×4 array for the p-electrode plus two for the n-electrode. FIGS. 11a and 11b show cross-sectional views of this embodiment. FIG. 11a shows an embodiment that includes vias within a patterned dielectric 42 for solder pads 41 on the LED die. Likewise, a patterned dielectric 53 is provided with vias for solder pads 54 on the submount. In the embodiment shown in FIG. 11b, the solderable metal 41 on the LED die is made larger than the solder bumps in order to allow the solder to spread out and wet an area much larger than their individual diameters would provide. This results in a solder area coverage in excess of that of the sum of the individual bumps in FIG. 11a. Also, the solder thickness is effectively reduced. Both of these effects reduce the thermal resistance of the solder junction and allow the LED die to be driven to higher current densities for increased light output.

Figure 12A:
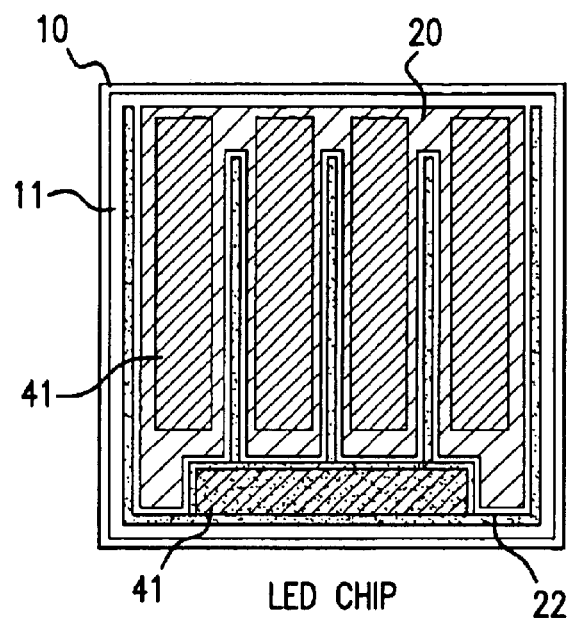
FIGS. 12a–b illustrate the plan views of an LED and submount, respectively.
Figure 12B:
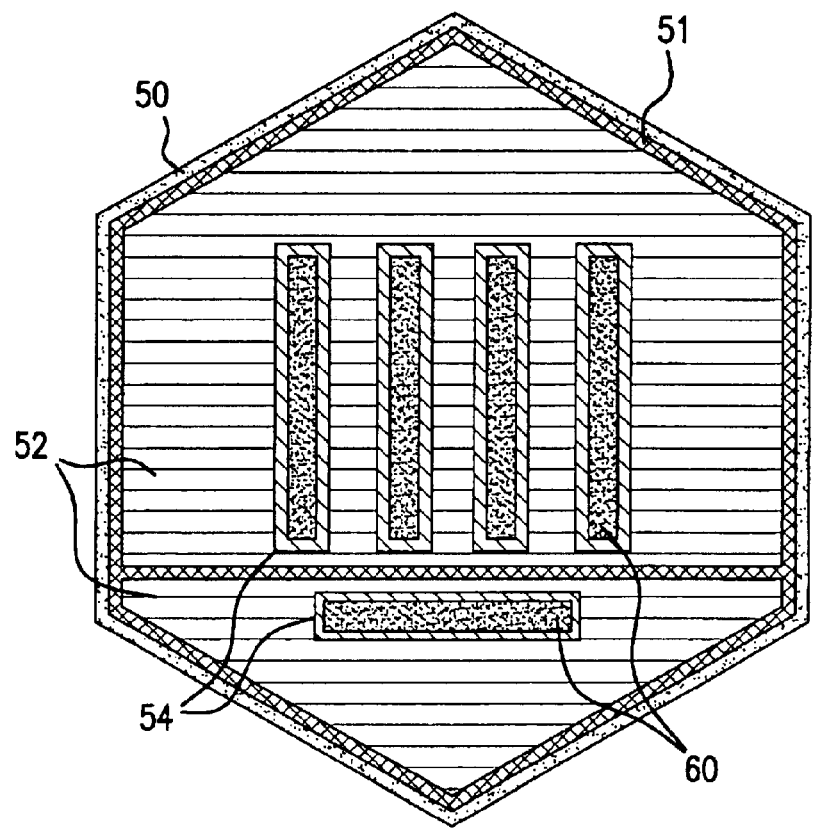

It is further possible to form the solder into arbitrary shapes other than bumps to match the wettable metal patterns on the LED to provide for a device with excellent thermal contact to the submount, shown in FIGS. 12a–b. FIG. 12a shows a plan view of the bottom of the LED. Solderable metals 41 are patterned on the p-electrode 20 and n-electrode 22 metallizations, defining wetting areas for the solder during reflow. Alternatively, the wetting areas may be defined by a dielectric passivation layer 42 as shown in FIGS. 6–8. FIG. 12b shows a plan view of the submount. While the lateral submount geometry is arbitrary, a hexagonal design is shown. The submount includes a substrate 50, e.g. Si. An optional dielectric layer 51, e.g. SiO$_2$, may be included for electrical isolation between the LED die and the submount substrate. Alternatively, the submount substrate may be electrically connected to the LED die for integration with electronic circuits fabricated into the submount substrate. Metallization 52, e.g. Ag or Al, is provided as a reflector for downwardly emitting light from the LED die as well as for wirebonding. A break in the metallization 52 is provided to electrically isolate the p and n regions of the LED die after attachment. Solderable metals 54 are patterned on top of the wirebond metallization 52 to define wetting areas for the solder during reflow. These patterns match those of the solderable metallization 41 on the LED die. As for the LED die, the wetting areas on the submount may be defined by a dielectric passivation layer 53 as shown in FIG. 10b. Solder material 60 is deposited on the submount solderable metallization 54. Alternatively, the solder material 60 may be deposited on the LED die. The edges of the solder may be recessed slightly from the edges of the solderable metal patterns 54. Control over the solder layout, defined by the wetting areas 41 and 54 and solder pattern 60, depends upon the solder application process. It is preferable that as much of the p-electrode 20 as possible is covered with solder after reflow. The wetting areas in FIGS. 12a–b provide ~66% coverage of the p-electrode 20 with solder. While the solder layout in FIGS. 12a–b is comprised of bars, arbitrary patterns are certainly possible and allow for further increase in solder area coverage of the p-electrode.

A suitable interconnect between the LED and submount can allow the maximum operating temperature of the LED to be increased beyond 130° C., the typical maximum rating. This is the case when the interconnect is thermally stable at temperatures greater than 130° C. In the case of solder, therefore, it is desirable to use high-temperature solders, e.g. 95/5 Pb/Sn, AuSn, AuSi, and AlSi, for this interface. A high-temperature interconnect raises the maximum junction temperature of the LED and provides a significant increase in maximum driving current and thus light generating capability.

It is important to maintain the integrity of the p electrode during solder reflow. That is, the reflectivity and contact resistance of this layer should not be degraded by the presence of solderable metal layers or the solder itself. Such degradation may be caused by metal intermixing between the p electrode and the solderable metal layers, or by strain-induced effects such as delamination. For this reason, it may be necessary to provide barrier layers between the p electrode and the solderable metals. Suitable barrier layers include, but are not limited to, Ni, Cr, Cu, and Ti.

For large LED die dimensions, the difference in the coefficient of thermal expansion (CTE) between the LED die, the submount, and the casing, may cause fatigue and eventual failure at the LED/submount attach interface under thermal cycling stress conditions. The CTE problem is most likely to occur for large sheet-solder attach designs than for smaller sheets (or bars or bumps). Therefore, smaller solder shapes may be a preferable method for attaching large LED die. Also, thicker solder sheets or taller solder bumps may provide more compliance between the LED and submount, reducing the risk of failure. The trade-off here between minimizing thermal resistance and the onset of CTE problems results in an optimum solder attach design for a given LED die size. For a 1 mm² die and 15% solder area coverage, the solder thickness may be as little as 20 µm without causing failures during temperature-cycling stress conditions.

Figure 13A:
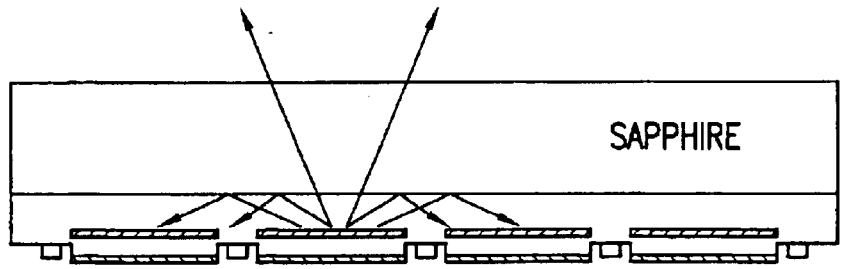
FIGS. 13a–c illustrate alternate embodiments and the corresponding paths of light.
Figure 13B:
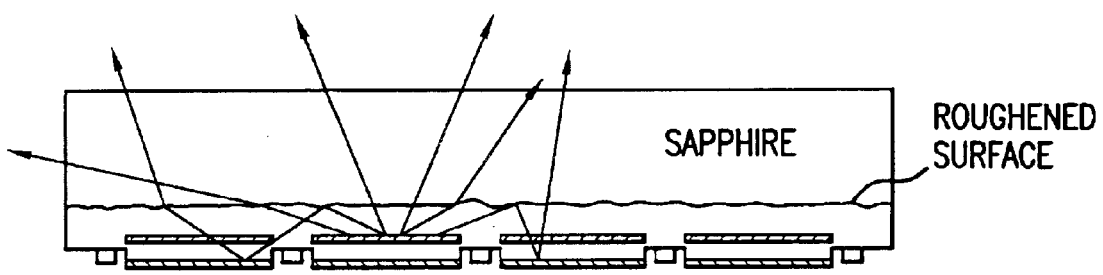
Figure 13C:
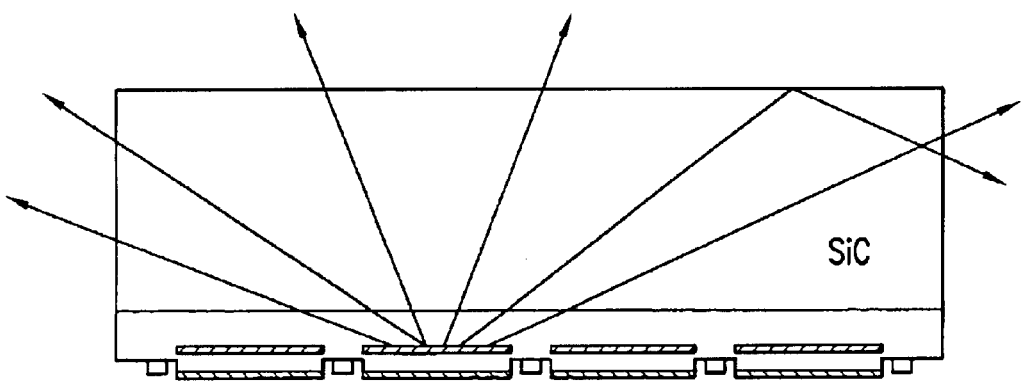

Light extraction of the LED can be increased by providing a textured surface at one of the interfaces of the III-nitride heterostructure. The texturing may be random or ordered. This is This is illustrated in FIGS. 13a–c. FIG. 13a shows an inverted device employing a sapphire superstrate. The large refractive index mismatch (n~0.6) between the sapphire superstrate and the III-nitride epitaxial layers results in a large portion of the light generated from the active region to be totally-internally-reflected at the sapphire/III-nitride interface. This light is trapped and guided laterally along the device towards the sides of the die. However, because of the many loss mechanisms present in the III-nitride epi layers and electrodes, most of the waveguided light is lost before escaping the device. In FIG. 13b, the interface between the III-nitride heterostructure and the sapphire superstrate is textured in order to scatter light out of the III-nitride layers. This reduces the mean photon path-length within the heterostructure and reduces the effect of internal absorption, thus improving light extraction. A similar effect can be achieved by texturing the bottom surface of the III-nitride heterstructure, or at one of the interfaces within the heterostructure. Multiple interfaces may be textured in combination to further increase light extraction.

In an alternate embodiment, light extraction is improved by providing an inverted die configuration which includes a high-refractive-index (HRI) (n>1.8) superstrate that has a closer index match to the III-nitride layers (n~2.4) than sapphire (n~1.8). A closer index match to the III-nitride layers making up the light generating regions allows more light to be coupled into the thick superstrate and allows light to escape into the ambient before absorption at one of the many loss mechanisms present in and around the III-nitride epitaxial layers. FIG. 13c illustrates such an embodiment, wherein a SiC superstrate is used. The refractive index of SiC is ~2.6 and is much closer matched to GaN than sapphire is. Thus, there is very little probability for total internal reflection and consequently no waveguide is formed within the III-nitride layers. Virtually all light generated from the active region is coupled into the superstrate and has a high probability for escape through one of the five exposed superstrate surfaces. Even with an HRI superstrate, further improvement in light extraction can be gained by texturing one or more interfaces of the III-nitride heterostructure.

Figure 14:
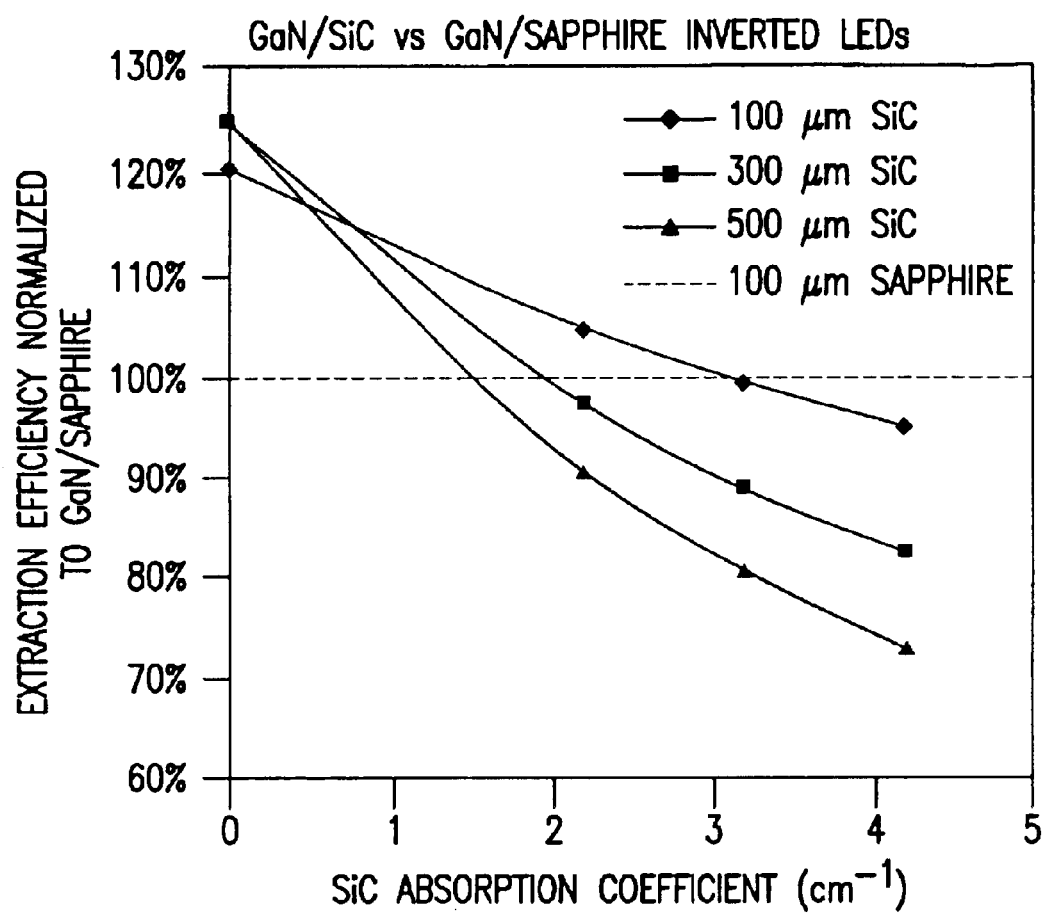
FIG. 14 shows extraction efficiency of GaN/SiC inverted LEDs as a function of the SiC absorption coefficient.

To derive full benefit of a HRI superstrate, the superstrate must be substantially transparent with very little absorption. Thus, for SiC, the superstrate should be lightly doped or not doped at all, and the growth method should provide a superstrate relatively free of impurities to provide a very low loss optical window for the LED device. For 6H SiC, this is generally the case when the resistivity is greater than 0.5 µcm. The effects of absorptive loss within SiC are quantified in FIG. 14, where extraction efficiency (normalized to a device using a sapphire superstrate) is plotted as a function of distributed loss (absorption coefficient, in $cm^{-1}$) within the SiC superstrate. These results are obtained by ray-trace modeling of the LED device structures. Three different thicknesses of SiC are shown. For a SiC superstrate ~100 µm thick, the absorption coefficient should be less than 3 $cm^{-1}$. For thicker substrates, the absorption coefficient must be lower. In the case of a lossless SiC superstrate, the extraction efficiency gains are greater than 1.2× over earlier embodiments within the present device.

There are many HRI superstrates suitable for improving the light extraction efficiency of a III-nitride LED. In addition to SiC in its many different polytypes (2H, 4H, 6H, both c- and a-axis, 3C, etc.), other materials such as ZnS, ZnSe, YAG, or ZnO, may be used. The HRI superstrates may serve as growth substrates for the III-nitride epi layers or may be attached to the III-nitride epi layers by bonding or a second growth step.

Figure 15:
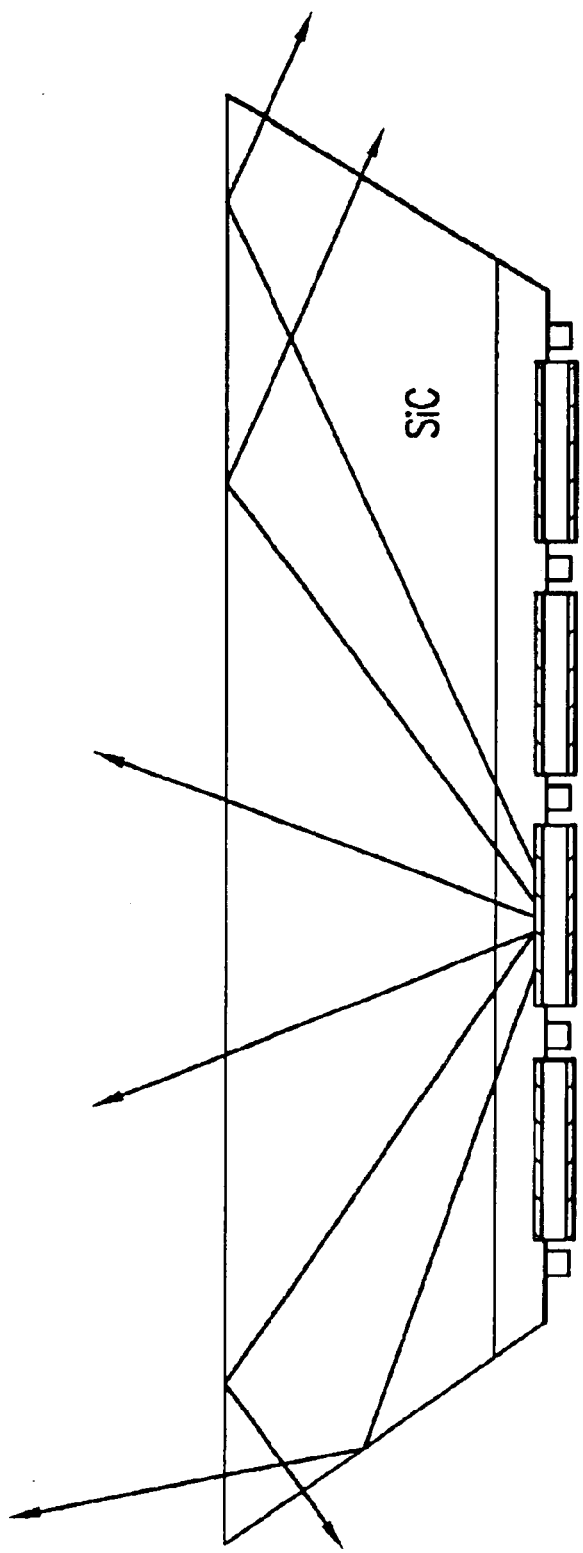
FIG. 15 illustrates an embodiment having an inverted pyramid for the superstrate.

Significant benefit to extraction efficiency may be obtained by providing a light-randomizing surface at one or more of the faces of the HRI superstrate as well on or within the III-nitride heterostructure. Such surfaces are provided naturally on device sidewalls by sawing, for example, or may be achieved by other means, e.g. etching. Also, the superstrate may be shaped to provide for improved extraction efficiency as shown by Krames et. al. in Appl. Phys. Lett. 75, pp. 2365–2367. One such shape is an inverted pyramid design, such that the top surface of the superstrate has a surface area larger than that of its bottom surface. This embodiment is illustrated in FIG. 15.

The submount can provide functionality and affect performance. Because it is in the thermal path for heat removal from the LED, the submount material should have high thermal conductivity. Suitable materials include Si, AlN, or BeO. The submount should be relatively thin to reduce thermal resistance. For example, a Si submount should be less than 250 µm. Si is attractive as a submount material because of its good thermal conductivity, ~100 W/mK, and capability for integrated electronics. The submount may provide an electrical isolation between the LED and the package. In this case, two connections for the anode and cathode are required on the top surface of the submount to the package leads. Alternatively, if electrical isolation of the package is unnecessary and if the submount is conductive, one electrode can be contacted through the submount to the package. Then only one interconnect is required from the top of the submount to the opposing lead. The top surface metallization of the submount should be wire bondable and also reflective, to redirect downward travelling light upwards with high efficiency. Hence, Ag and Al are suitable choices for the submount top surface metallization.

Figure 16:
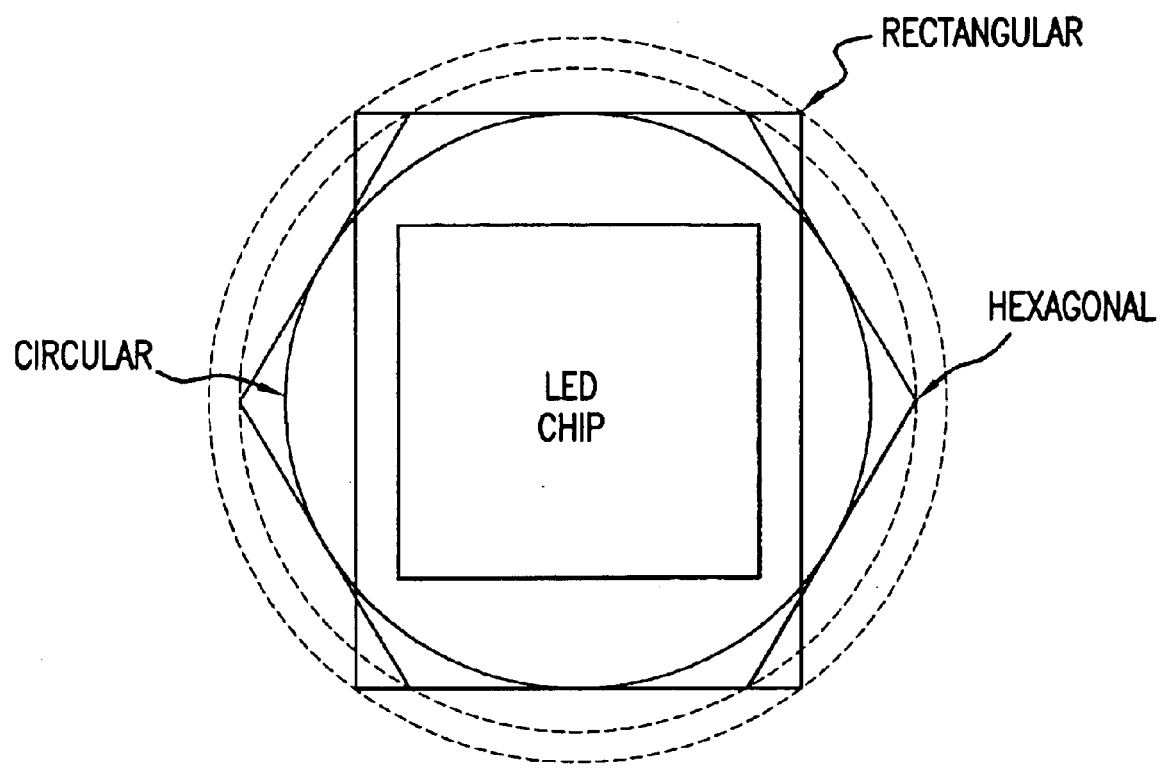
FIG. 16 illustrates alternate embodiments for the submount.

The submount shape, as well as the specularity of the reflective metallization atop the submount, can impact the optics in an LED lighting system by affecting the apparent source size of the LED. Most LEDs require a reflector cup to redirect light emitted predominantly laterally from the die upwards and within the useful radiation pattern. The larger this reflector cup must be, the larger the primary and any secondary lenses must be. Since optics costs are proportional to the volume of material required, it is desirable to minimize the reflector cup radius. The inclusion of a submount effectively increases the size of the LED die, because of the extra space needed for wirebond connections. Typical wirebond tolerances require that ~400 µm material extends beyond the LED die for reliable wirebonding. Also, dicing the submount wafer requires ~100 µm of space between neighboring LED die. These tolerances result in a significant effective increase in LED die size. For example, a 1×1 mm² LED die would require a 1.8×1.1 mm² area using a rectangular geometry for the submount. The largest extent of this submount is a diagonal equal to $(1.8^2+1.1^2)^{1/2} = 2.11$ mm, which puts a lower limit on the diameter for the reflector cup. Instead, if the submount is shaped as a disk, the largest extent of the submount is merely 1.8 mm. Thus, a disk-shaped submount allows for a significant reduction in reflector cup diameter. Because circular cuts can be difficult to manufacture, other geometrical shapes which approximate circular disks are preferable. For example, hexagonal submounts may be fabricated by multiple-pass sawing (three passes instead of two) and are preferable to square or rectangular submounts. These ideas are illustrated in FIG. 16. The reflective metallization on top of the submount should be as specular as possible, so as not to create a virtual source in the plane of the submount which is larger than the LED die. A virtual source size larger than the LED die would have a deleterious effect on the radiation pattern of the LED and require larger optics to correct.

The submount, shown in FIGS. 6b, 9b, and 12b, allows for electronic functionality within the LED. III-nitride devices are susceptible to Electro-static Discharge (ESD) damage and may be protected by a power shunting element electrically connected to the LED as described in Antle et. al. U.S. Pat. No. 5,941,501. For the present devices, a Si submount may be embedded with circuitry for integrated ESD protection. In this case the protection circuits, e.g. Zener diodes, are connected in parallel with the LED die. Alternatively, back-to-back Zener diodes may be fabricated in parallel with the LED die to allow the LED to be driven by alternating-current power supplies. Other electronic devices may be included within the submount, e.g., photo-detectors for monitoring light output or resistors for monitoring current and/or voltage. These devices will allow an integrated system to provide closed-loop feedback control for maintaining constant light-output operation.

Figure 17A:
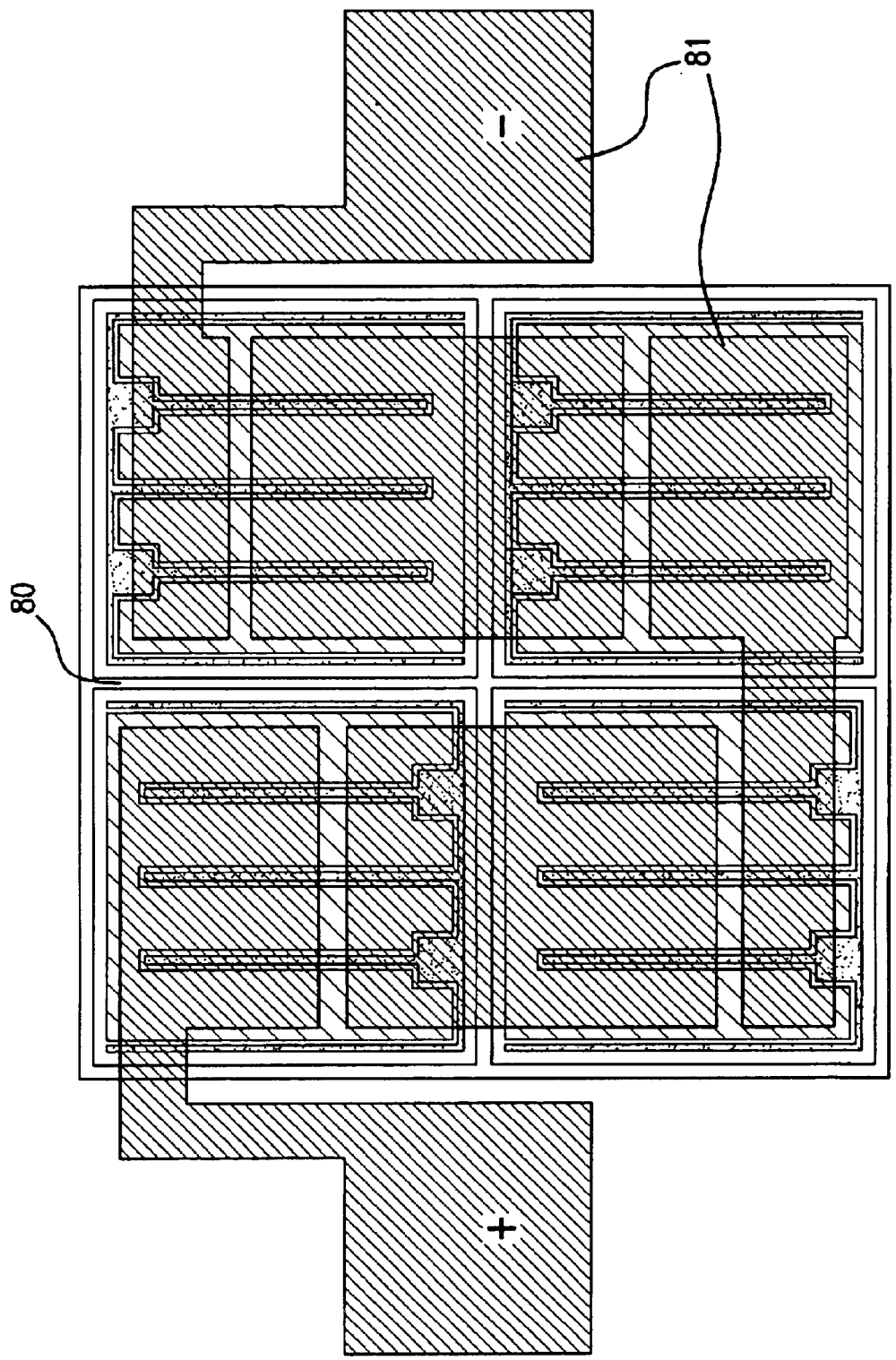
FIGS. 17a–b illustrate multiple series-interconnected light emitting structures.
Figure 17B:
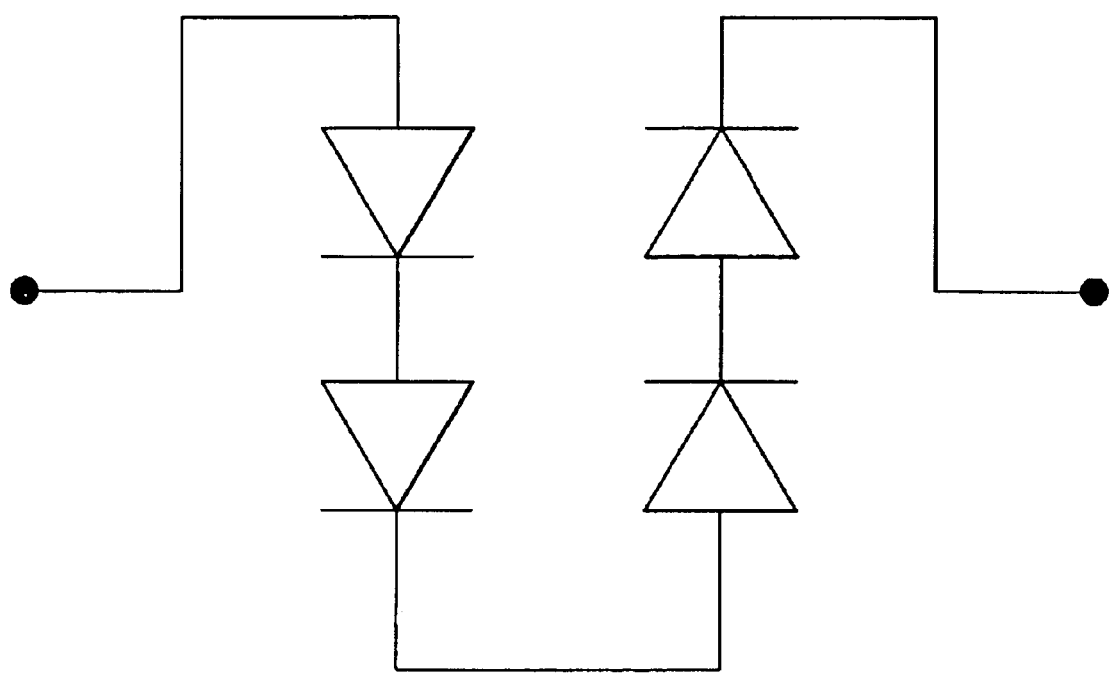
Figure 18:
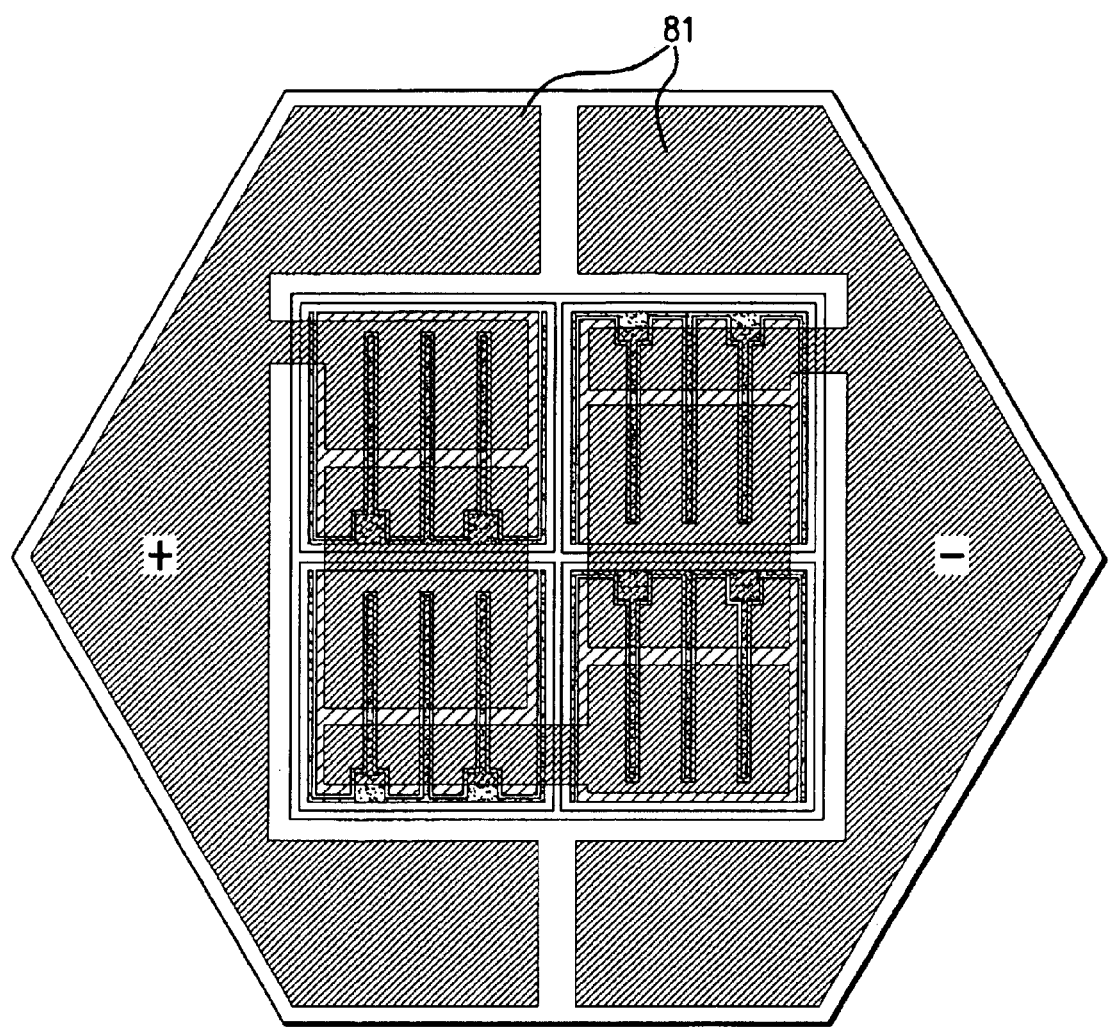
FIG. 18 illustrates multiple series-interconnected light emitting structures connected to a submount.

A submount provides for an LED based on multiple series-interconnected light-emitting diodes in a monolithic structure as shown in FIG. 17a. The assembly has four serially connected LEDs that are electrically isolated via etching to remove III-nitride material to form a trench 80 between them. The etching proceeds to at least the undoped III-nitride layers. The electrical interconnections are provided by metallic traces 81 laid out on the submount (not shown). The solder metallization is designed so that the diodes are electrically connected to the submount metallic traces via the solder. The resulting device may be represented by the electronic circuit shown in FIG. 17b. This device thus operates at 4× the voltage, and 4× less current, than a conventional LED of the same active junction area. For example, a 1 mm² conventional III-nitride LED may operate at 3.0 V and 350 mA. This same active junction area, broken up into four series-interconnected LEDs as shown in FIG. 17a, provides a device operating at 12.0 V and 87.5 mA. This higher voltage, lower current operation places less demand on the electronic driver circuit for the LED. In fact, the electronic driver circuit can run at higher efficiency at higher voltages, improving the overall efficiency of the LED lighting system. This embodiment, a monolithic device, is preferred over a conventional approach of attaching individual LED die in series. In the conventional approach, the total area taken up by the LED die is increased because of the tolerances required by die-attach machines. This undesirably increases the optical source size of the total LED and requires an increase in subsequent optics sizes in the LED system. In the preferred embodiment, the diodes may be spaced as close together as allowed by the trench etching for electrical isolation. The trench width may be as small as a few microns, so that the packing density of diodes in the embodiment can be very high. As shown in FIG. 18, the four 1 mm² LED die are monolithically fabricated and share a single superstrate and submount. The metal traces 81 on the submount electrically connect the four LEDs in series. While each 1 mm² LED normally operates at 3V, the four serially-connected LED module in FIG. 18 operates at 12V. The submount design is hexagonal to reduce the effective optical source size of the module. The trace metallization 81 is used for wirebonding for external connection and consists of a reflective metallization, e.g. Ag or Al.

Light extraction efficiency may be further improved by placing the active region layers near the highly reflective p-electrode. When the center of the active region is brought within approximately an odd multiple of quarter-wavelengths of light within the material ($\sim\lambda/4n$) from the reflective p-electrode, constructive interference of the downward and upward travelling light results in a radiation pattern that emits power preferentially in the upward direction. This enhancement is in a direction close to normal to the III-nitride/substrate and is not susceptible to total internal reflection back into the III-nitride epi layers. Alternatively, slight detuning of the resonance condition, by moving the active region slightly closer to (or farther from) the p-electrode reflector, may be preferred to optimize the light extraction improvement for total flux in all directions. For maximum efficiency in most applications, the distance between the active region and the p-electrode should be approximately one quarter-wavelength.

Figure 19:
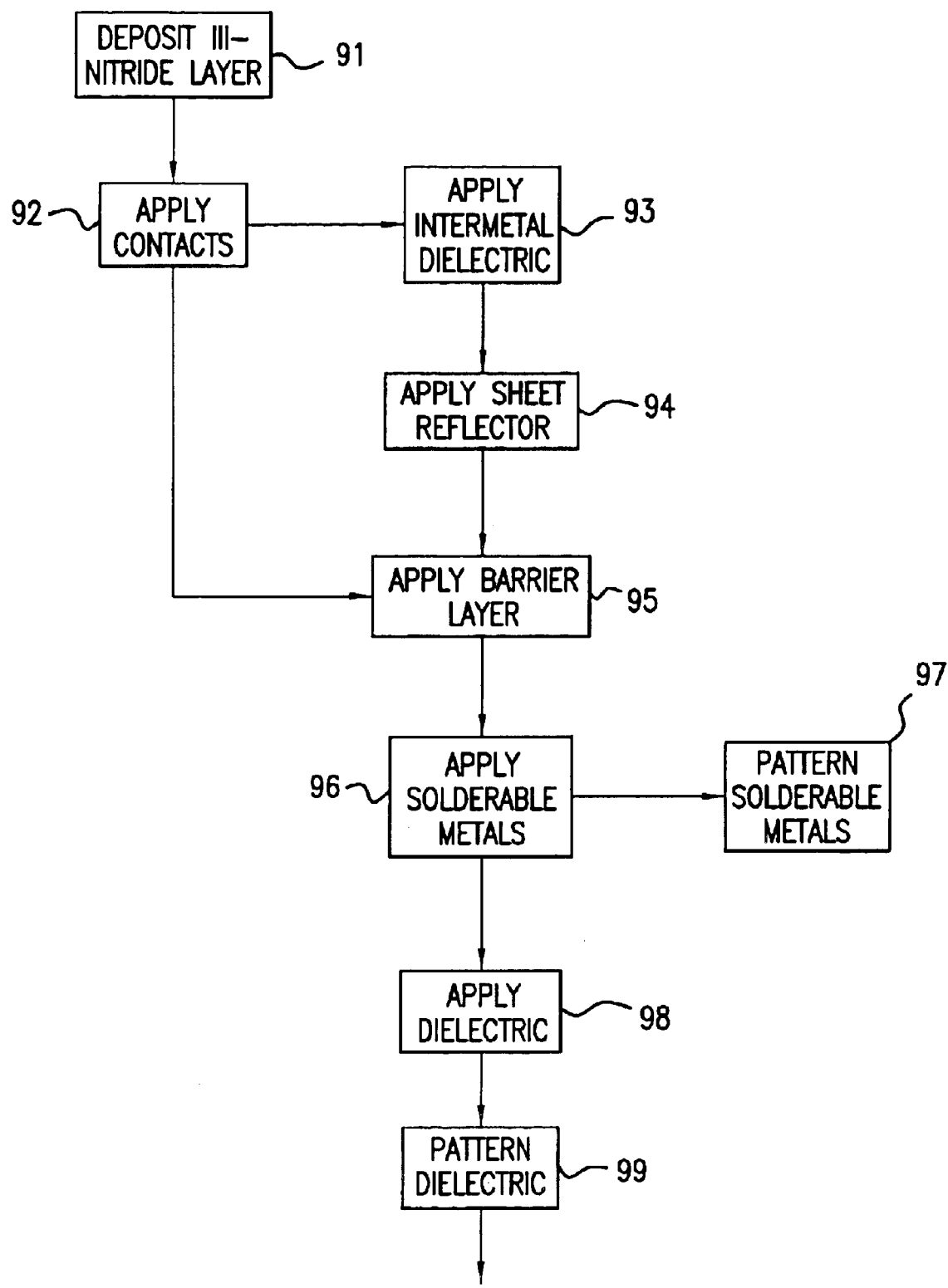
FIG. 19 illustrates a flowchart for manufacturing the III-nitride LED.

FIG. 19 illustrates a process flowchart for fabricating the LED die. In step 91, a III-nitride heterostructure is deposited on a growth substrate. In step 92, contacts are applied to the III-nitride heterostructure, etching if necessary. The p-contact is opaque and electrically connected to the p-type layer while the n-contact is electrically connected to the n-type layer. In optional steps 93 and 94, an intermetal dielectric is applied over at least the n-contact in regions where the n-contact interposes the p-contact and a sheet reflector is applied respectively. In step 95, an optional barrier layer is applied to protect the contacts and reflector from solder. In step 96, solderable metals are applied. In optional step 97, the solderable metals are patterned. In step 98, dielectric is applied to define the solderable areas. In step 99, the dielectric is patterned. The LED die may be attached to the submount after step 97 or step 99.

Figure 20:
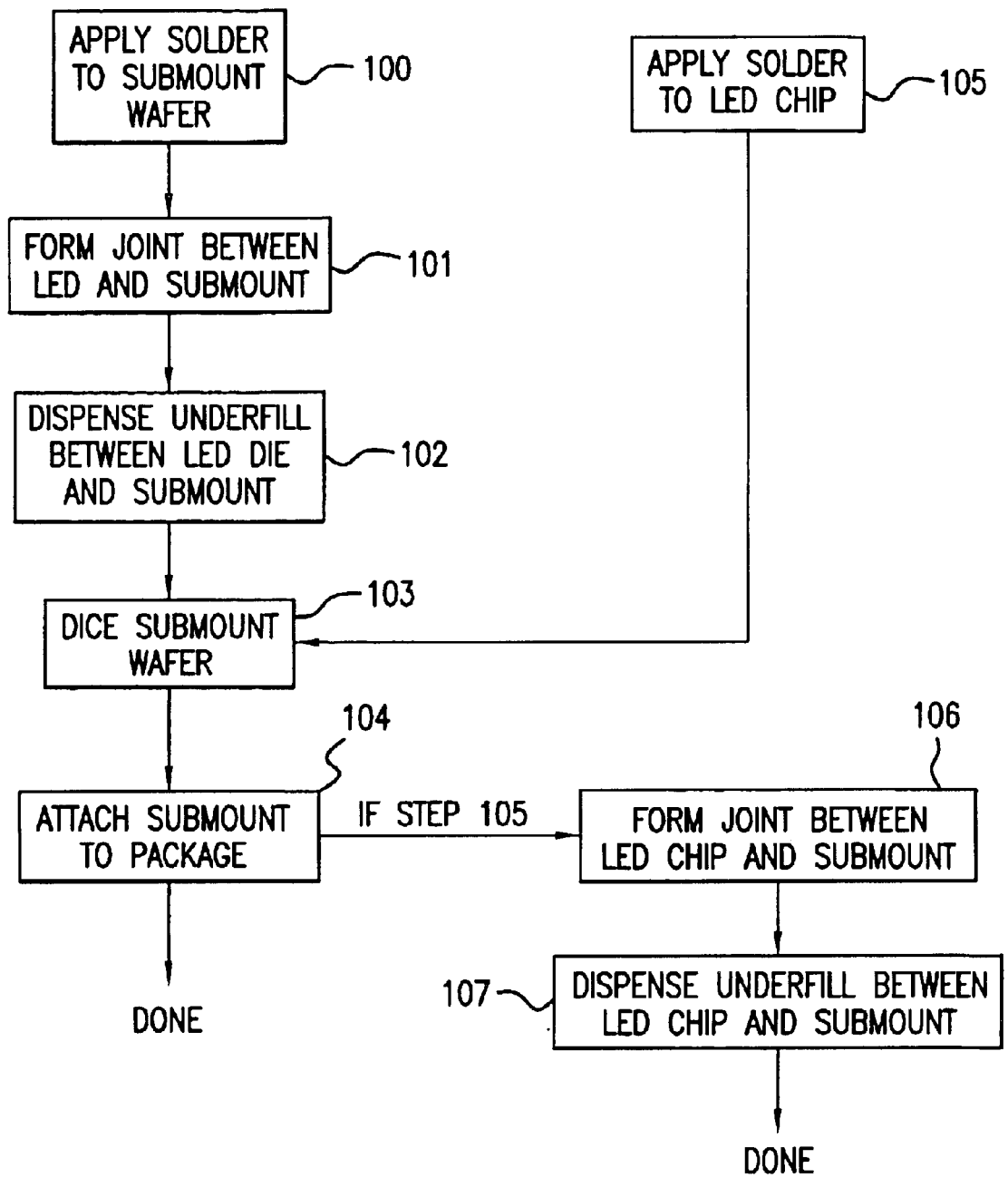
FIG. 20 illustrates a flowchart for attaching the III-nitride LED to a submount.

FIG. 20 illustrates a process flowchart for attaching the LED to the submount. In step 100, solder is applied to the submount wafer. In step 101, a joint is formed between the LED die and the submount. In optional step 102, underfill is dispensed between the LED die and the submount. In step 103, the submount wafer is separated. In step 104, the die and submount are attached to the package.

Alternatively, step 105 is completed in lieu of steps 100, 101, and 102. In step 105, solder is applied to the LED. In step 106, a joint is formed between the LED die and the submount wafer. In optional step 107, underfill is dispensed between the LED die and submount.

Additional Embodiments

Figure 21:
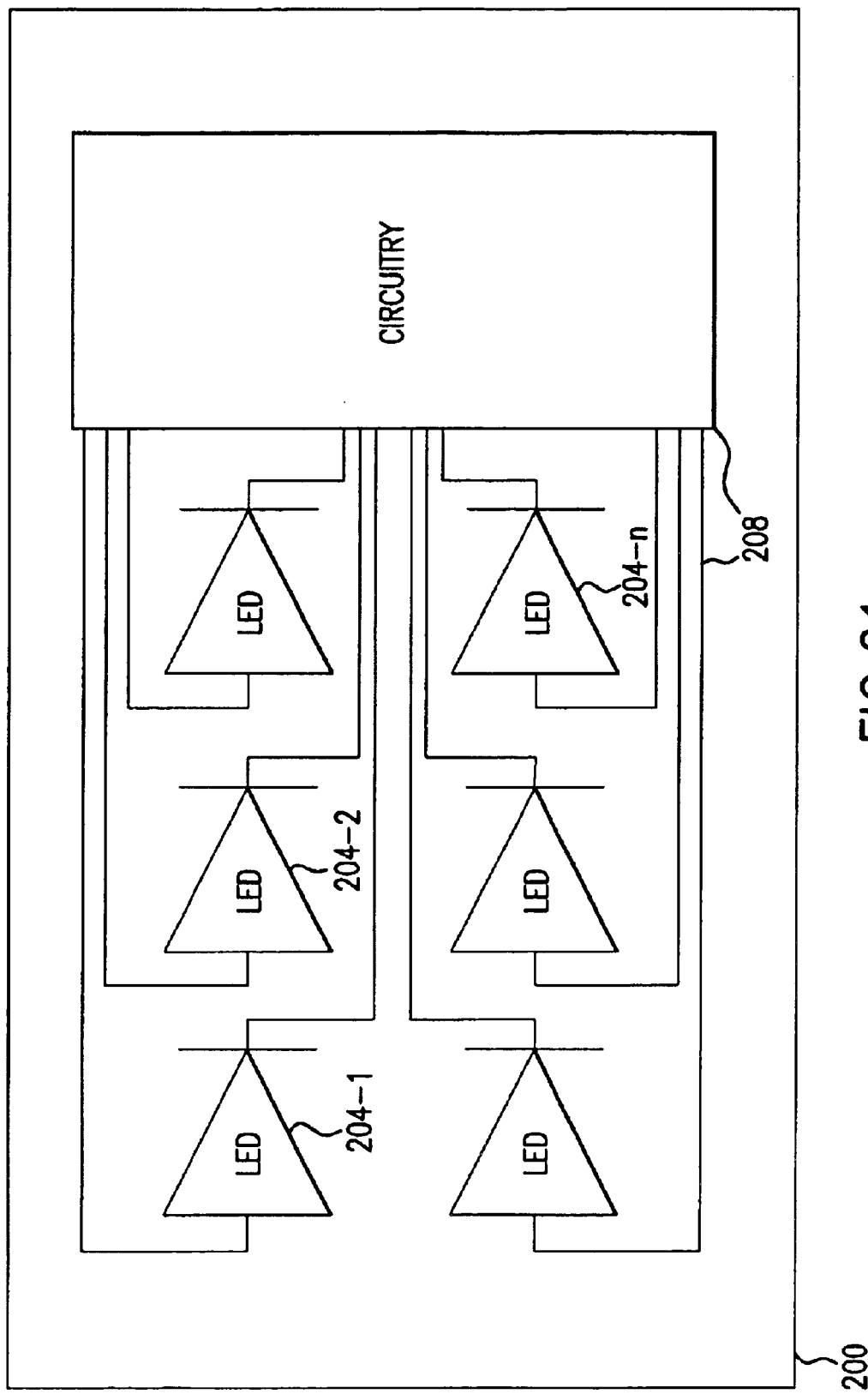
FIG. 21 illustrates a plurality of LEDs, mounted on a shared submount, coupled to circuitry.

FIG. 21 shows a block diagram of a LED device according to the present invention. LEDs 204-1 through 204-n are mounted on a shared submount 200 and are coupled to circuitry 208 formed on or in submount 200. LEDs 204-1 through 204-n can be of any architecture (standard or inverted) and of any wavelength. If shared submount 200 is a silicon chip, any type of circuitry 208 may be formed on the submount using conventional integrated circuit fabrication techniques. Circuitry 208 may include metal (e.g., Al or Cu alloy) traces only or in combination with active or passive circuitry.

Figure 22:
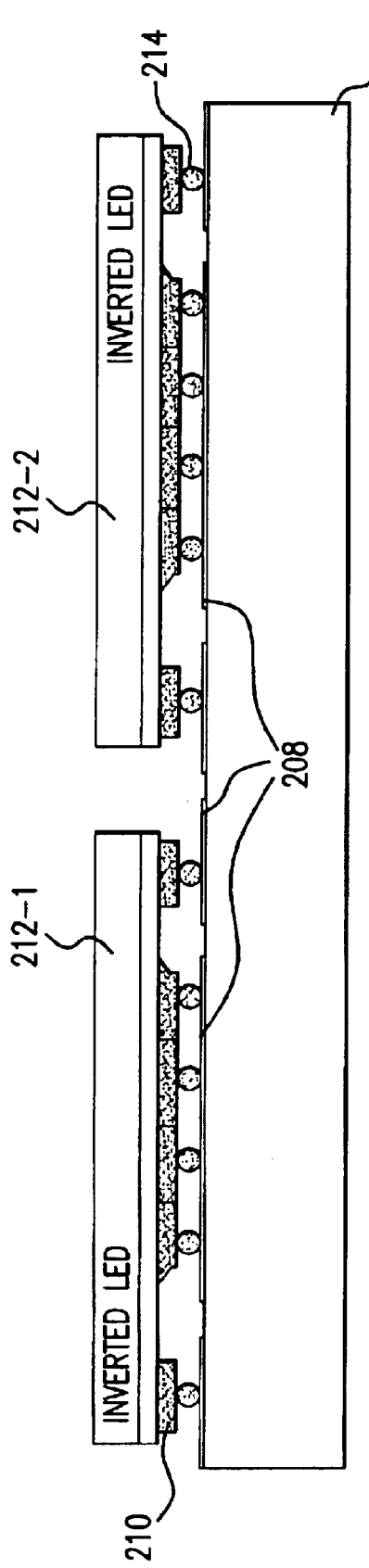
FIG. 22 illustrates a side view of inverted LEDs, mounted on a shared submount.

FIG. 22 shows a side view of a further embodiment. This embodiment includes two inverted LEDs 212-1 and 212-2, but, in general, a plurality of n LEDs 212-1 through 212-n may be included. LEDs 212-1 through 212-n can be, for example, of the III-nitride type. This composition includes, but is not limited to, GaN, AlGaN, AlN, GaInN, AlGaInN, InN, GaInAsN, and GaInPN. Typical substrate materials are sapphire, silicon carbide SiC, or III-nitrides, because of the ease of nucleating and growing high quality III-nitride crystals on these substrates. As explained in detail in the previous section, in these inverted devices the p and n contact pads 210 are formed on the same side of the device. Contact pads 210 can be subsequently soldered to circuitry 208 by solderballs 214. Alternative methods of coupling contact pads 210 to circuitry 208 include forming an ultrasonic bond, or forming a eutectic joint, or applying conducting epoxy or paste between contact pads 210 and circuitry 208. The generated light is coupled out of the LED on the side opposite to the contact pads, through the substrate.

III-Nitride LEDs are typically formed on sapphire, silicon carbide, or III-nitride. mnitride grown on such substrate is expensive and the materials technology is still in its infancy. In contrast, silicon is cheap and silicon devices and technology are well understood. For this reason using silicon as a submount for inverted LEDs 212-1 through 212-n is an advantageous embodiment of the present invention. It allows for utilizing conventional integrated circuit fabrication techniques to form a wide variety of control circuitry on the silicon shared submount.

Having the LEDs and their control circuitry on the same shared submount creates a compact light emitting device, which has many advantages over previous architectures. It is advantageous in applications where space is limited, such as in displays, or in compact light sources. The achieved high element densities are also advantageous in high power illumination applications. The compactness of the devices makes them resemble more closely an ideal point source of light, thus the secondary optics, manipulating the emitted light, are simpler and thus cheaper to produce. Also, the need for wire bonds to the LEDs has been reduced. Finally, integration of LEDs with their control logic creates "smart LEDs," which are compact, controllable, and programmable sources of monochromatic or multicolored light.

Figure 23:
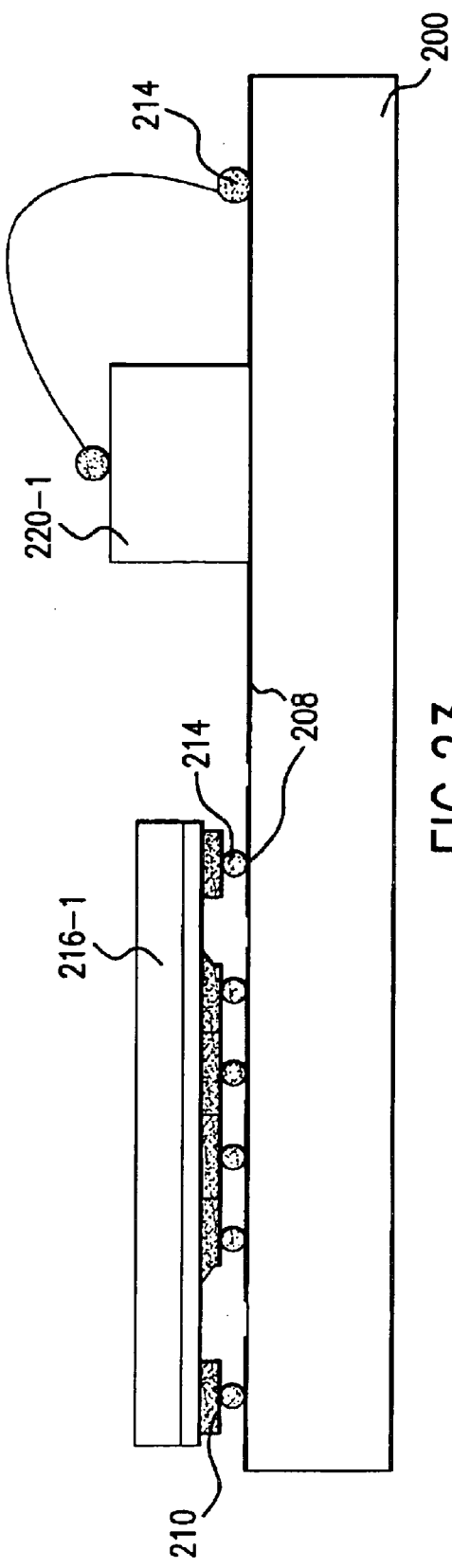
FIG. 23 illustrates a side view of inverted LEDs and standard LEDs, mounted on a shared submount.

FIG. 23 shows a further embodiment, where a combination of inverted LEDs 216-1 and standard LEDs 220-1 are mounted on shared submount 200. In related embodiments a group of inverted LEDs 216-1 through 216-n and standard LEDs 220-1 through 220-m can be included. Both inverted LEDs 216-1 through 216-n and standard LEDs 220-1 through 220-n can be III-Nitride type or any other type capable of emitting any wavelength.

Figure 24B:
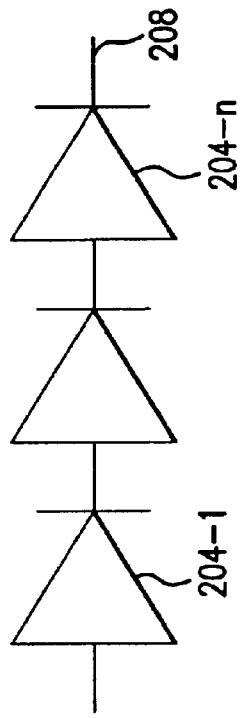
FIGS. 24a, 24b and 24c illustrate different circuitry connecting LEDs according to the present invention.
Figure 24C:
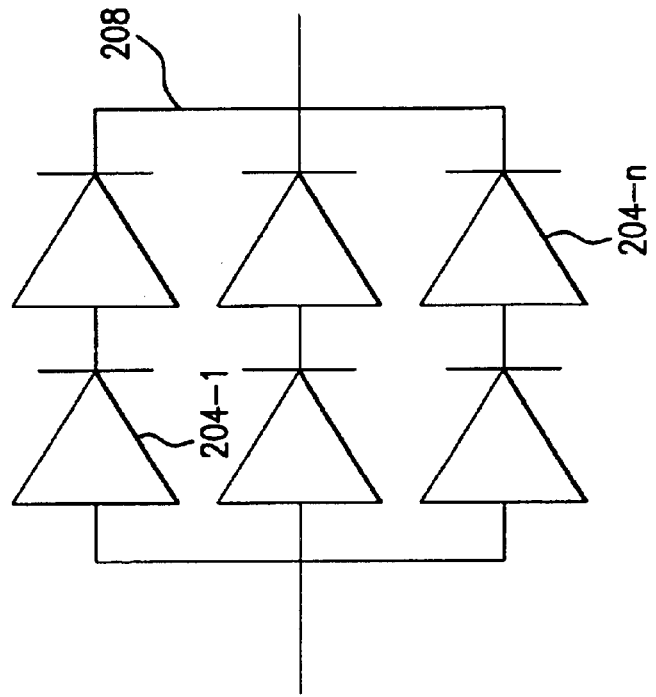
Figure 24A:
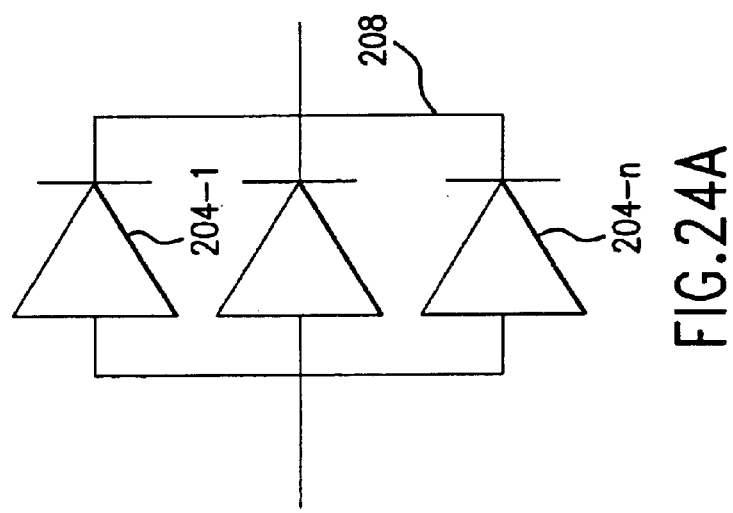

FIGS. 24a–c show some embodiments incorporating different circuitry. FIG. 24a shows LEDs 204-1 through 204-n coupled in parallel. FIG. 24b shows LEDs 204-1 through 204-n coupled in series. Connecting LEDs in series offers an improved utility. Typical operating voltages for a III-Nitride LED, such as, for example, an AlInGaN LED, are in the 2.4–4 V regime, whereas in many applications the driving circuitry operates at a different voltage. For example, in an automobile, a 12 V battery is driving the circuit. Constructing a circuitry that connects 3 or 4 LEDs in series will then operate each LED in the required voltage range, while driven by the standard 12 V automobile battery. Finally FIG. 24c shows LEDs 204-1 through 204-n coupled in a combination of series and parallel.

Figure 25:
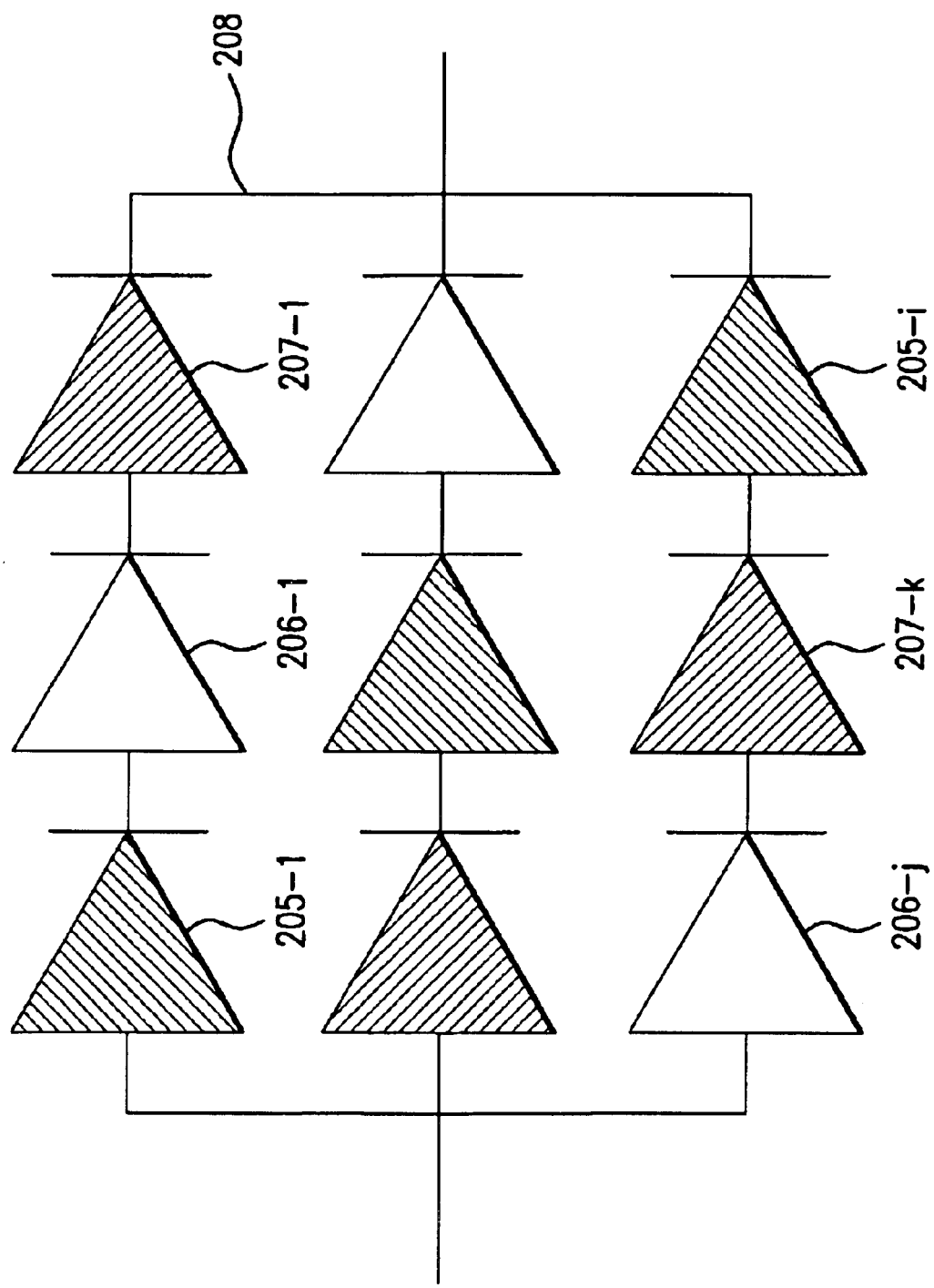
FIG. 25 illustrates circuitry including groups of same wavelength LEDs.

FIG. 25 shows a further embodiment. Same wavelength diodes 205-1 through 205-i are capable of emitting light with a first wavelength, same wavelength diodes 206-1 through 206-j are capable of emitting light with a second wavelength, and same wavelength diodes 207-1 through 207-k are capable of emitting light with a third wavelength. Here i, j, and k are arbitrary integer numbers. FIG. 25 shows the case of i=j=k=3. Same wavelength diodes 205-1 through 205-i, 206-1 through 206-j, and 207-1 through 207-k can be coupled in a combination of series and parallel. In some embodiments the three wavelengths can correspond to the three primary colors, red, green and blue. This embodiment is capable of emitting white light and can be used as an LED-lamp. White light producing LED-lamps have the potential to substitute for incandescent light bulbs in a vast number of applications. Red, green and blue LEDs can also be used in color displays.

In a further embodiment two or more LEDs with different wavelengths in the blue and ultraviolet regimes of the spectrum can be used, for example, in dental applications for curing materials used for fillings. More specifically two groups of LEDs, mounted on a shared submount, operating at wavelengths around 420 nanometers and around 470 nanometers may prove to be useful in dental applications.

Embodiments with other combinations of wavelengths and utilizing a larger number of wavelengths can be useful in further applications.

Figure 26:
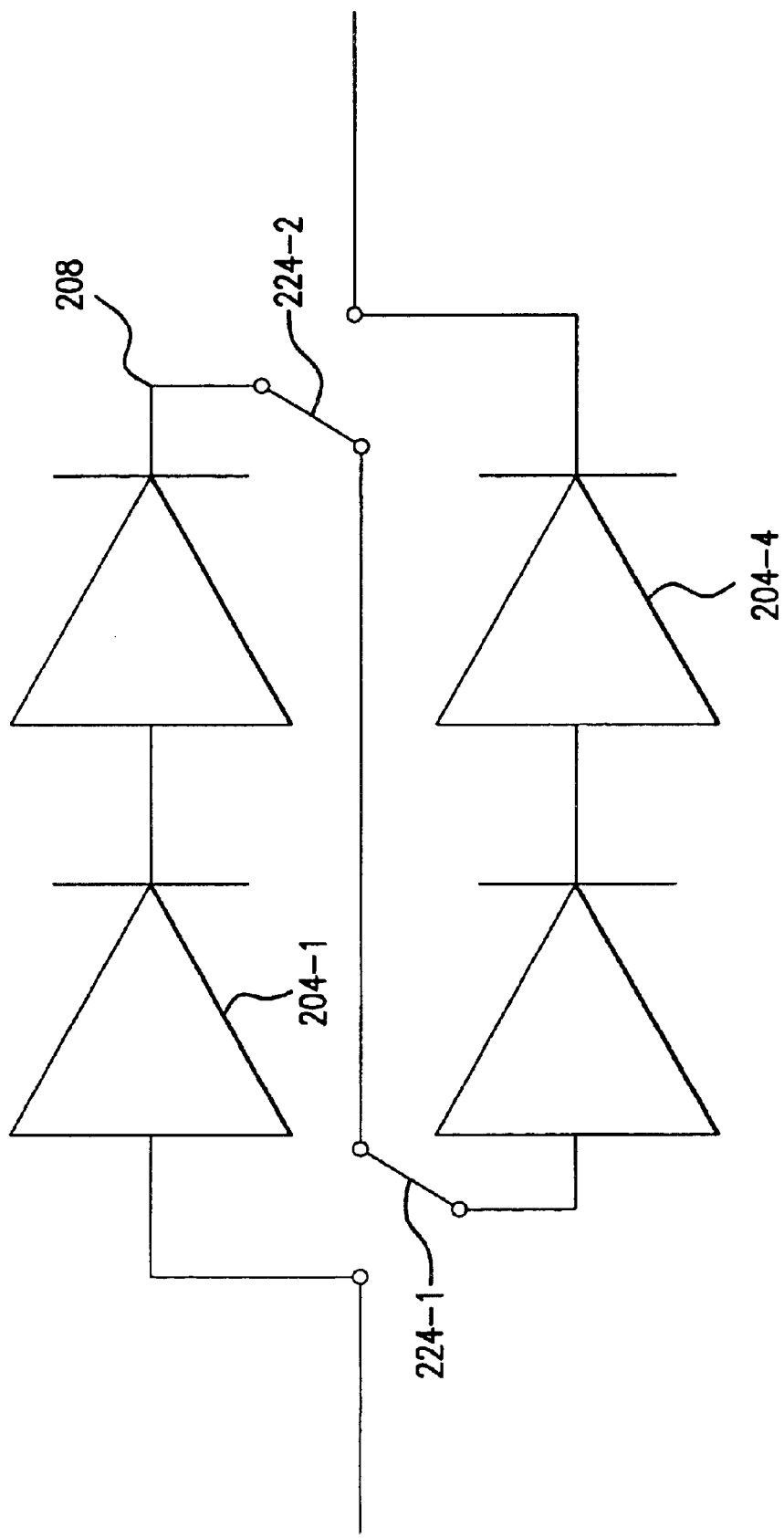
FIG. 26 illustrates circuitry including LEDs, further involving switches.

FIG. 26 shows a further embodiment, where circuitry 208 can be changed by switches 224-1 and 224-2. Switches 224-1 and 224-2 can comprise, for example, transistors and other components integrated into the silicon submount. In the illustrated setting of switches 224-1 and 224-2, LEDs 204-1 through 204-4 are coupled in series. If the setting of both switches 224-1 and 224-2 is changed, then the coupling of LEDs 204-1 through 204-4 becomes parallel. This feature may be advantageous for converting devices between different operating voltages and power supplies.

For all the embodiments, the active circuitry portion of circuitry 208 may constitute a programmable gate array on shared submount 200, which may be field or mask programmable.

Figure 27A:
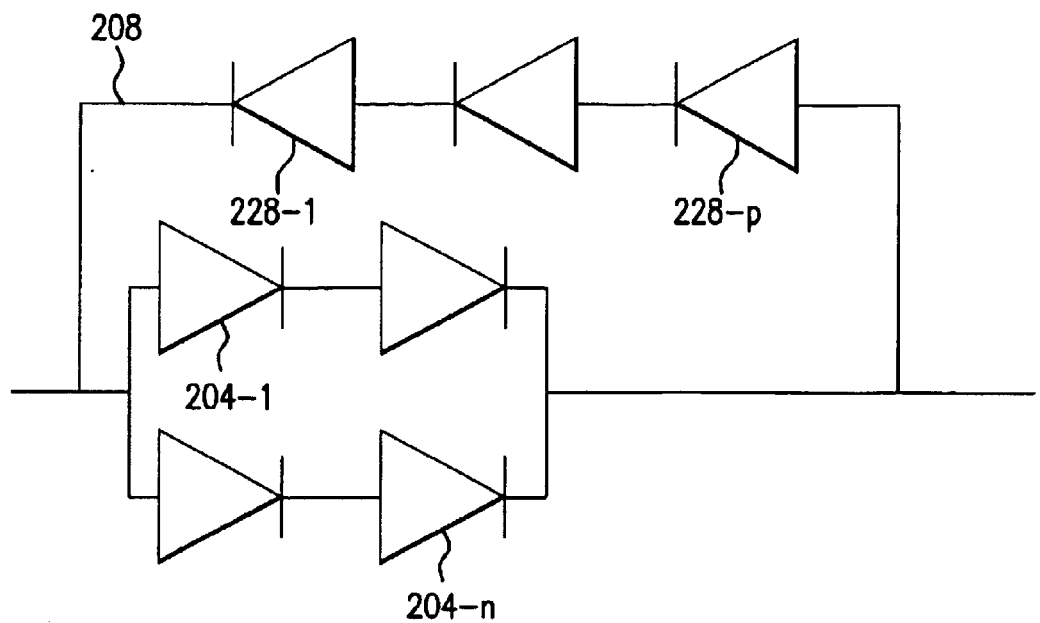
FIGS. 27a through 27d illustrate circuitry including power shunting diodes.

FIGS. 27a, b, c and d show further embodiments of circuitry 208, formed on or in submount 200, including one or more reverse biased power shunting diodes 228, coupled in reverse polarity relative to the polarities of LEDs 204-1 through 204-n. This architecture offers good Transient Voltage Suppression (TVS) and defense against Electrostatic Discharge (ESD), both leading causes of circuit failure, occurring, for example, during installation of LED devices, or power surges.

FIG. 27a shows an embodiment where the submount has circuitry for integrated ESD protection. The embodiment includes a generic circuit of LEDs, coupled in a combination of series and parallel. Serially coupled one or more power shunting diodes 228-1 through 228-p can be, for example, Zener diodes, coupled in parallel with the generic circuit of LEDs 204-1 through 204-n, with a polarity opposite to LEDs 204-1 through 204-n. Here n and p are positive integers. The required number of serially coupled Zener diodes can be calculated from comparing the operating voltage of the circuit of LEDs 204-1 through 204-n to the breakdown voltage of a power shunting diode 208-1.

Figure 1:
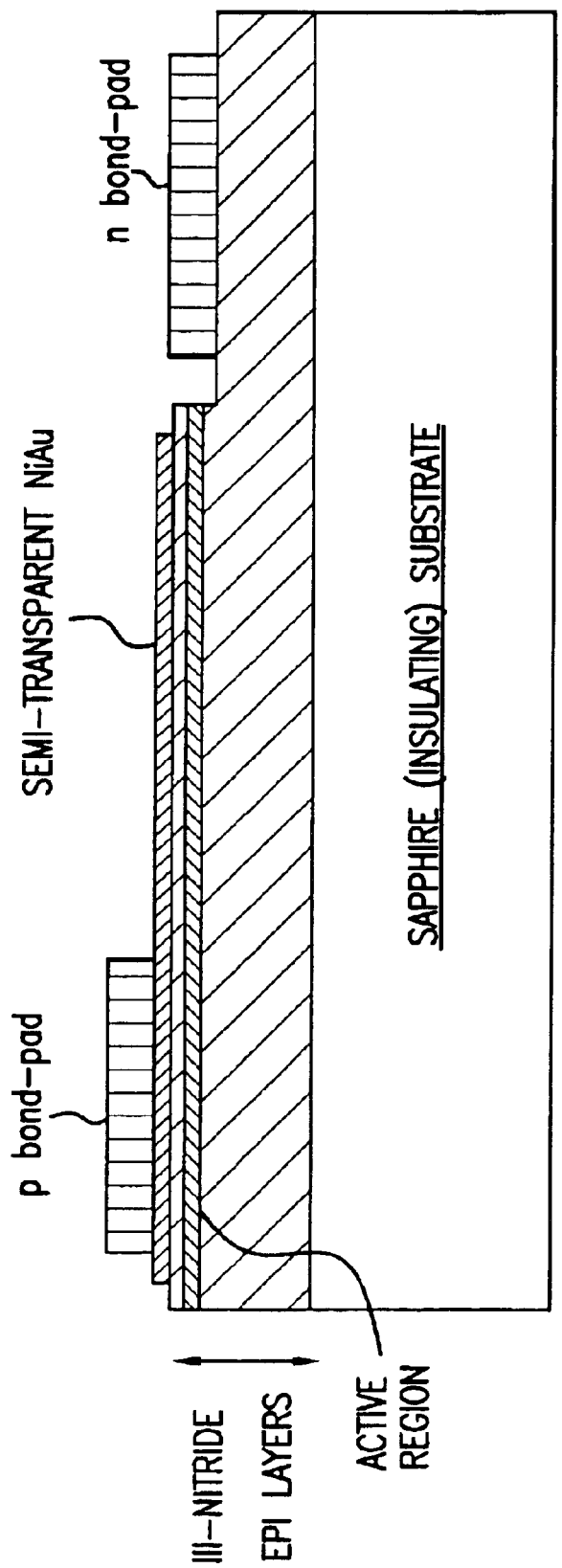
FIG. 1 shows a prior art III-nitride light emitting device with a sapphire substrate.
Figure 2:
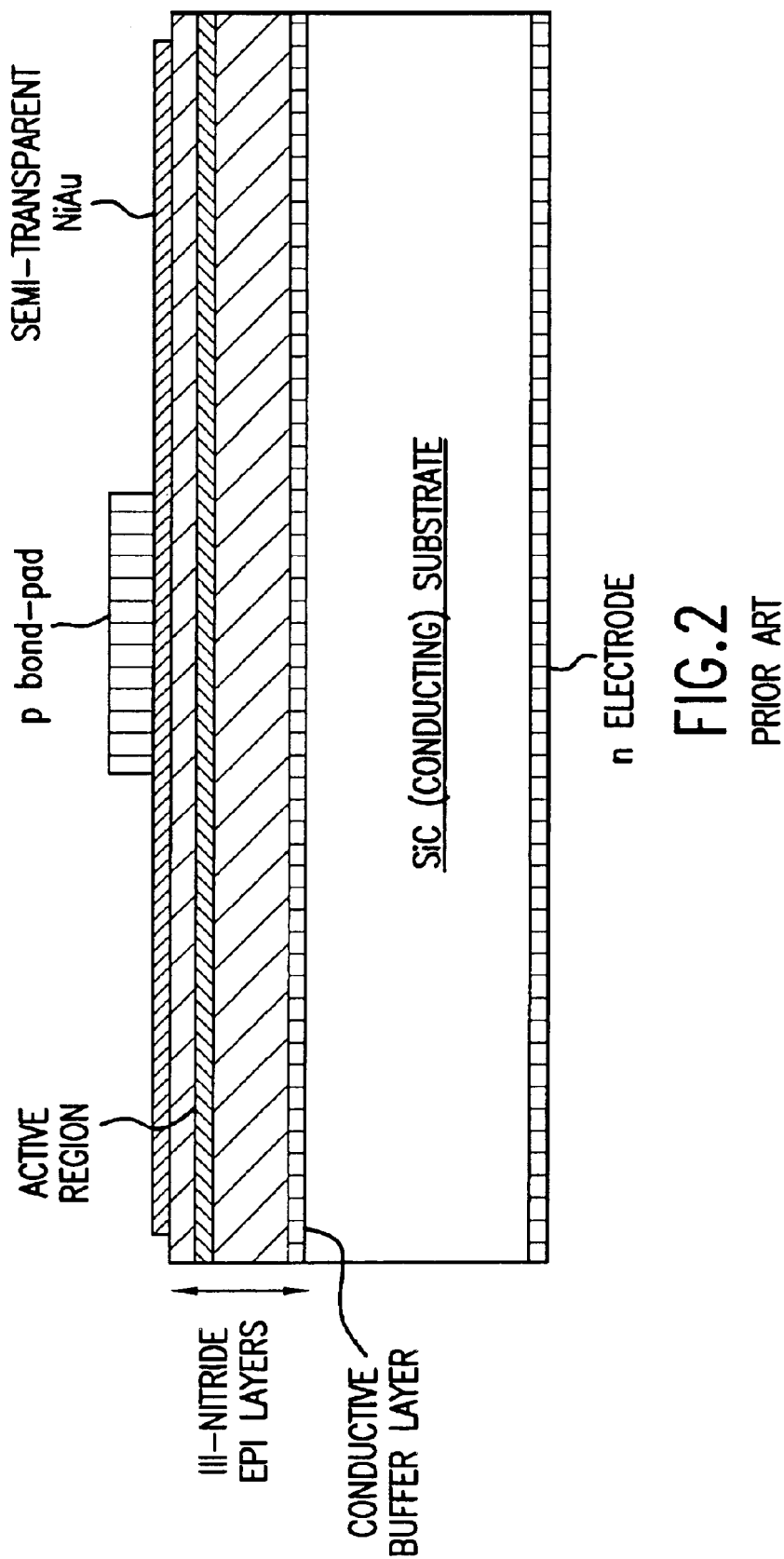
FIG. 2 shows another prior art III-nitride light emitting device with a SiC substrate.
Figure 27B:
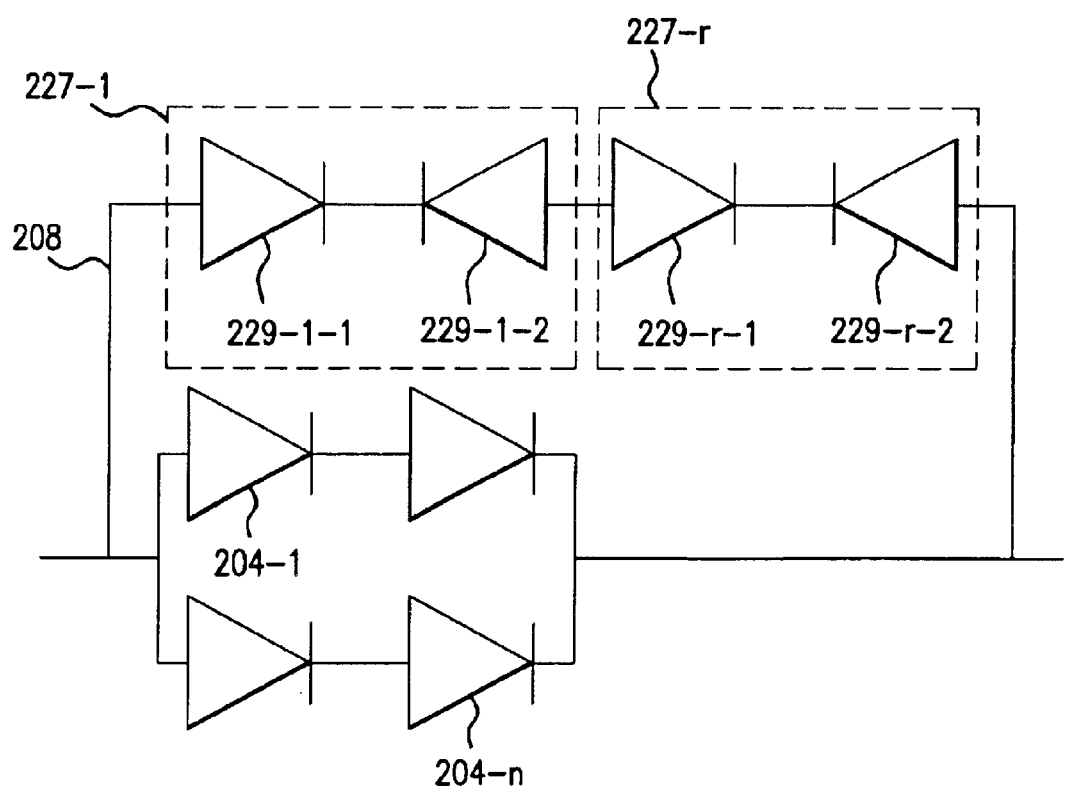

FIG. 27b shows another embodiment. Power shunting diodes 229-1-1 and 229-1-2 can be coupled in series, with their polarities opposite to each other. They can be, for example, Zener diodes. Pair wise the power shunting diodes 229-1-1 and 229-1-2 through 229-r-1 and 229-r-2 can form assemblies 227-1 through 227-r, which can be coupled is series. Here r is a positive integer. Serially coupled assemblies 227-1 through 227-r then can be coupled in parallel to the generic circuit of LEDs 204-1 through 204-n to provide ESD protection. The circuit of power shunting diodes 228-1 through 228-p of FIG. 27a, and 229-1-1 through 229-r-2 of FIG. 27b can be designed to have a breakdown voltage above the normal operating voltage of LEDs 204-1 through 204-n. Detailed examples of power shunting circuit designs are described by Antle et al. in U.S. Pat. No. 5,941,501, and by Maeda et al. in EP 1 020 935 A2, which are incorporated herein by reference.

Figure 27C:
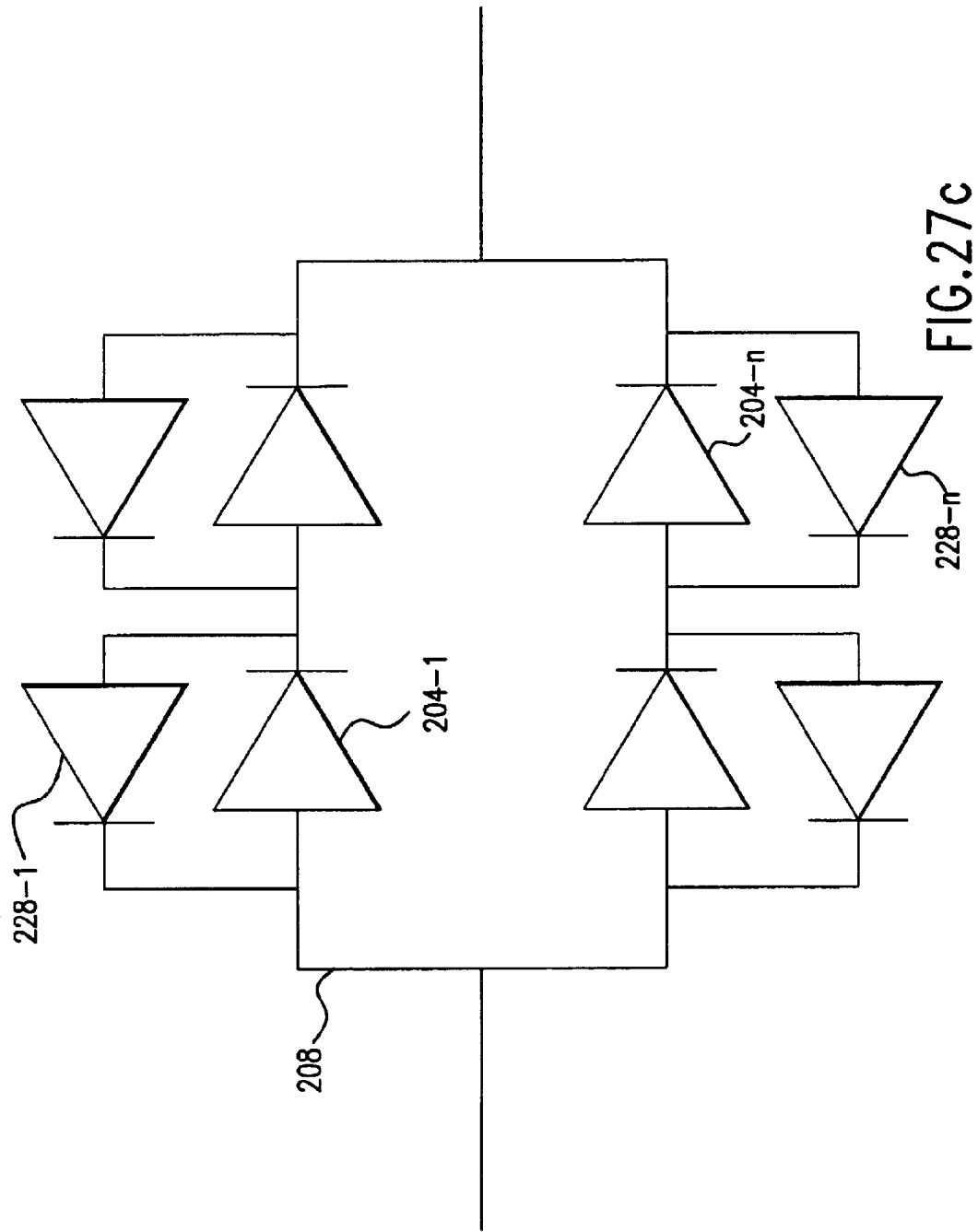

FIG. 27c shows an embodiment with a generic circuit of LEDs 204-1 through 204-n coupled in a combination of series and parallel, where LEDs 204-1 through 204-n individually have Transient Voltage Suppression circuits. In this case the TVS circuits include power shunting diodes 228-1 through 228-n, corresponding to LEDs 204-1 through 204-n. Power shunting diodes can be, for example, Zener diodes coupled in parallel with LEDs 204-1 through 204-n, with a polarity opposite of LEDs 204-1 through 204-n.

Figure 27D:
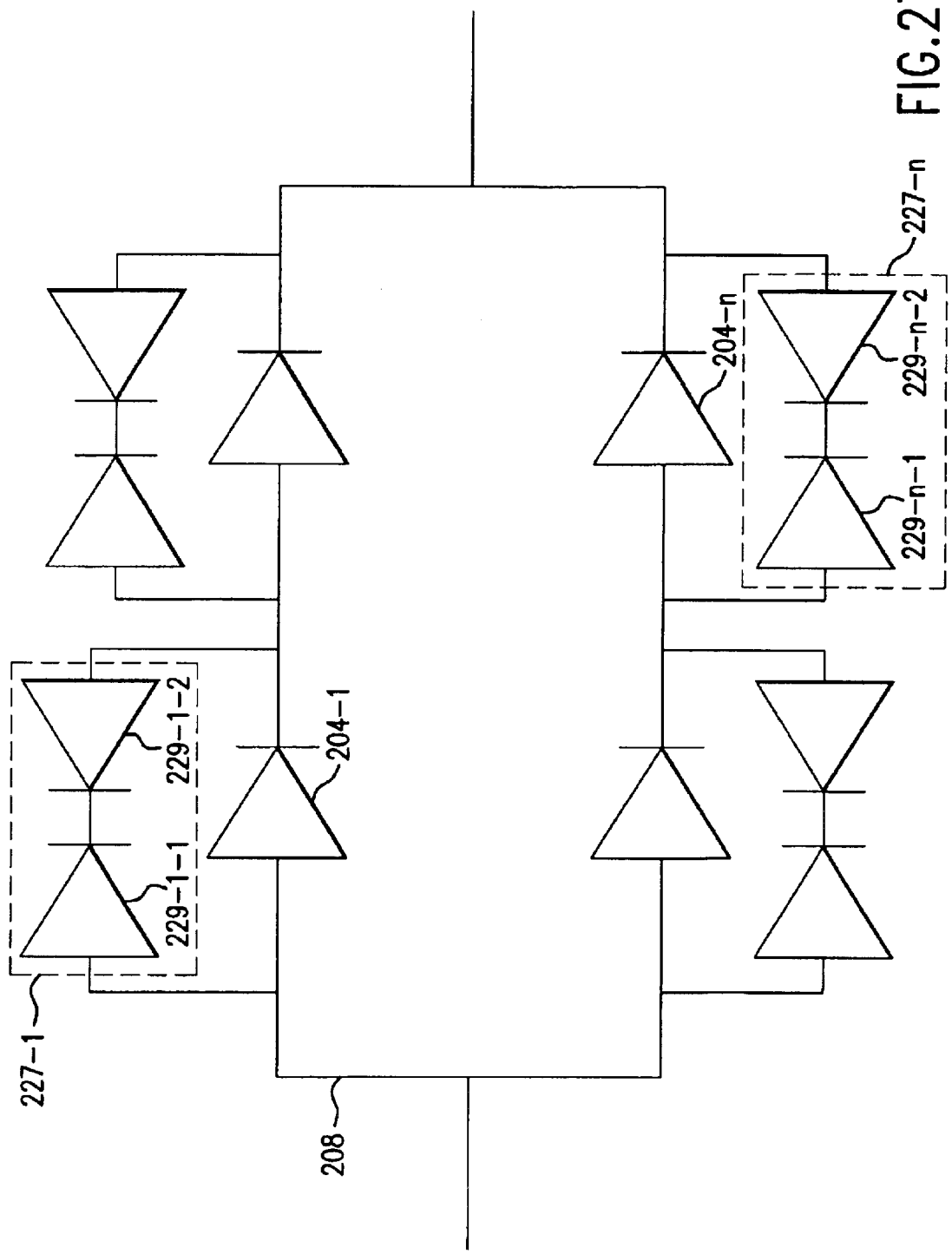

FIG. 27d shows an embodiment with a generic circuit of LEDs 204-1 through 204-n coupled in a combination of series and parallel, where LEDs 204-1 through 204-n individually have a different type of Transient Voltage Suppression circuit. In this case the TVS circuits include power shunting diodes 229-1-1 and 229-1-2, forming assembly 227-1 through 229-n-I and 229-n-2, forming assembly 227-n, corresponding to LEDs 204-1 through 204-n, respectively. 229-1-1 through 229-n-2 power shunting diodes can be, for example, Zener diodes. Assemblies 227-1 through 227-n can be coupled in parallel with corresponding LEDs 204-1 through 204-n individually to provide ESD protection from over-voltages by alternating-current power supplies. Detailed examples of power shunting circuit designs are described by Antle et al. in U.S. Pat. No. 5,941,501, and by Maeda et al. in EP 1 020 935 A2, which are incorporated herein by reference.

Figure 28A:
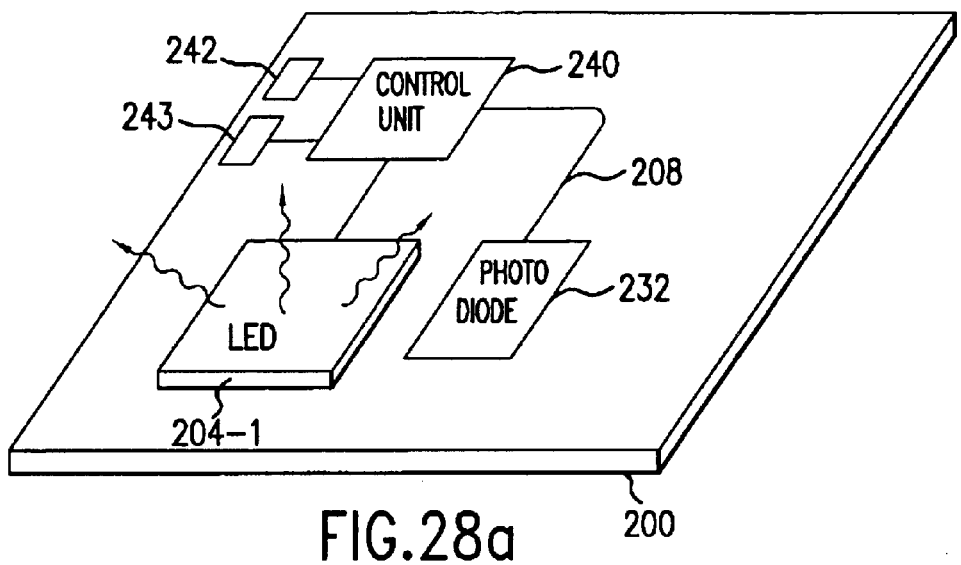
FIGS. 28a and 28b illustrate circuitry involving a photosensitive diode and a control unit.
Figure 28B:
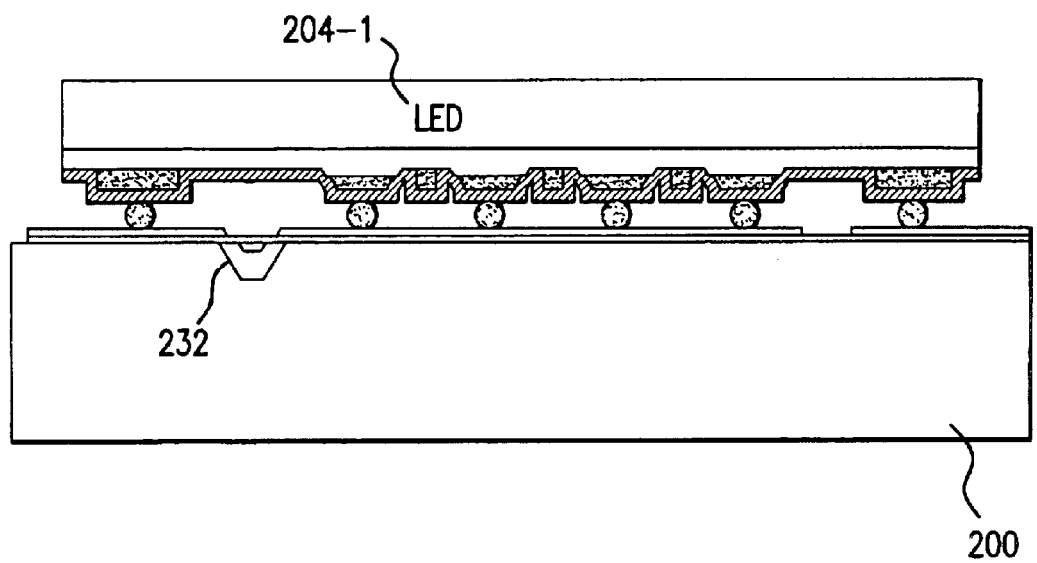
Figure 30:
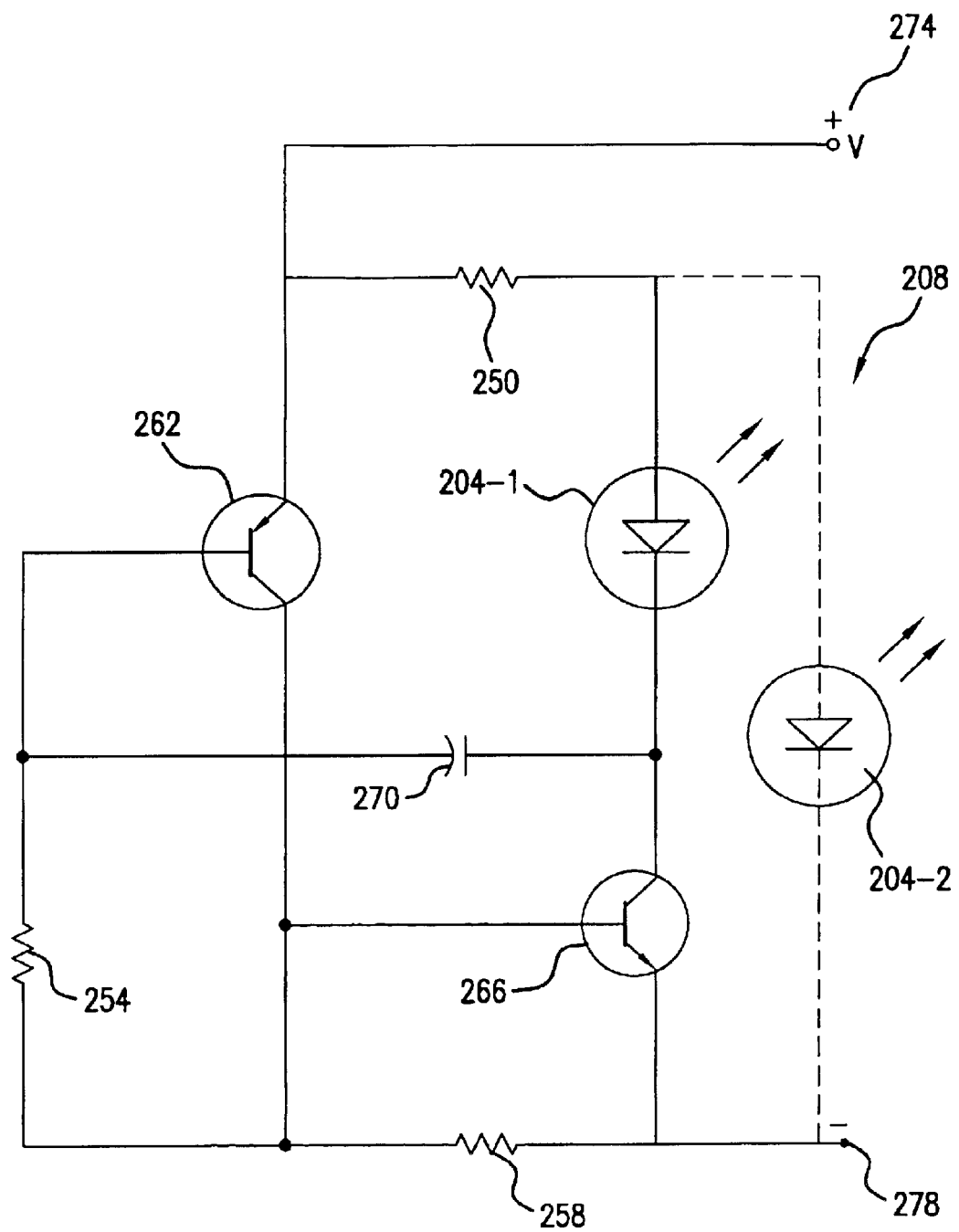
FIG. 30 illustrates circuitry involving a current distributor and a control unit.

FIGS. 28a, 28b, and 30 show embodiments, which include logic elements in circuitry 208 formed on or in shared submount 200. FIG. 28a shows an embodiment that includes a photosensitive diode 232, formed in shared submount 200, positioned to receive a portion of the light emitted by LED 204-1. Photosensitive diode 232 can be coupled to a control circuit 240.

FIG. 28b shows a further embodiment, which includes a photosensitive diode 232, formed in shared submount 200 under LED 204-1, such that it receives a portion of the light emitted by LED 204-1 through the side of the active region and the semiconductor layers adjacent to it, the so-called mesa-wall. Photosensitive diode 232 can be coupled to a control unit 240.

Figure 29:
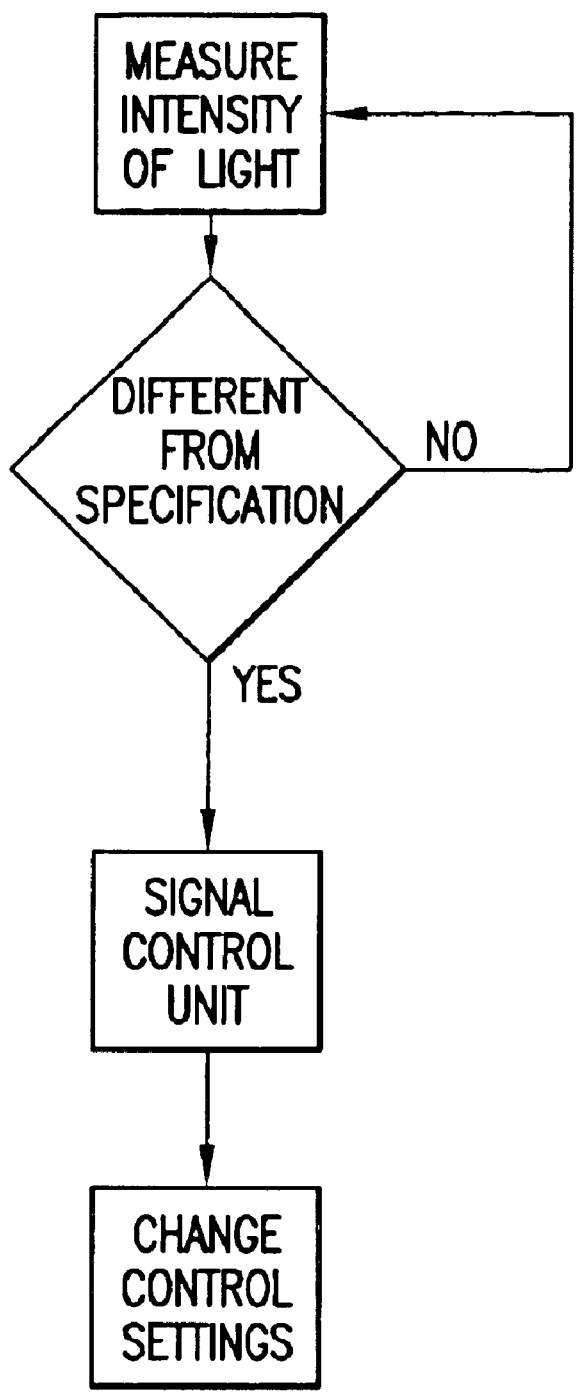
FIG. 29 illustrates a method of controlling the intensity of the emitted light.

The method of operating both above embodiments is illustrated in FIG. 29. Photosensitive diode 232 measures the intensity of the emitted light. If the intensity is found to deviate from a nominal value by more than a permitted tolerance, control unit 240 changes the current sent to LED 204-1. A power source electrode 242 and a ground electrode 243 may be formed at any position on submount 200.

In related embodiments a group of LEDs 204-1 through 204-n can be included on the submount 200. A group of photosensitive diodes may be further included in the embodiment, for example individually underneath the group of LED's 204-1 through 204-n. The photosensitive diodes are capable of monitoring the light emitted by corresponding LEDs. The photosensitive diodes are also coupled to control unit 240, which is capable of separately adjusting the current received by LEDs 204-1 through 204-n. The measurement and adjustment of the intensity of the emitted light can be performed in a continuous manner, or periodically.

These embodiments address the problem that individual LEDs exhibit a marked and differing decline of the intensity of the emitted light with time. This marked decline can lead to, for example, an undesired shift of colors in display applications. The present embodiment is capable of adjusting the current received by the individual LEDs 204-1 through 204-n so that the chromaticity, that is the intensity of the different wavelength lights within the emitted light beam remains preserved within some predetermined tolerance or range.

Another possible consequence of the marked decline of the intensity of an individual LED can be, that the total intensity of the light, emitted by LED's 204-1 through 204-n, may fall out of a prescribed intensity range, posing a problem, for example, in traffic light applications. The present embodiment is capable of adjusting the current received by LEDs 204-1 through 204-n individually so that the total intensity of the emitted light beam remains preserved within some predetermined tolerance or range.

A particular embodiment of a control circuit and photosensitive device for generating a signal related to light intensity is described by Fowler et al. in U.S. Pat. No. 5,461,425, which is incorporated herein by reference. Another control circuit has been described by Wychulis in U.S. Pat. No. 4,983,884, which is incorporated herein by reference.

FIG. 30 shows a further embodiment. It illustrates a circuit diagram of a known oscillator circuit, coupled to LEDs 204-1 and 204-2, however, in accordance with the present invention, the oscillator circuit is formed in the submount of LEDs 204-1 and 204-2. Resistors 250, 254, and 258, npn transistor 262, pnp transistor 266, and capacitor 270 form circuit 208, which is an oscillator circuit. In one embodiment this oscillator circuit can drive, or "strobe," only LED 204-1 (the dotted line and LED 204-2 omitted). In another embodiment it can drive both LEDs 204-1 and 204-2 (the dotted line and LED 204-2 included). A voltage V is supplied between contact points 274 and 278.

Many other oscillator circuits are known in the art, and the present example should be viewed only as a possible example. One skilled in the art will recognize many variations, which are intended to be within the scope of the invention.

The various controllers, logic functionality, and other circuitry mentioned above may be formed directly in the silicon submount either below the LEDs, or on another portion of the submount.

The embodiments discussed above are exemplary only and are not intended to be limiting. One skilled in the art will recognize variations from the embodiments described above, which are intended to be within the scope of the disclosure. As such, the invention is limited only by the following claims.

We claim:

1. A light emitting device, comprising:
a plurality of light emitting diodes, positioned on a shared submount; and circuitry, on said shared submount, wherein said plurality of light emitting diodes are coupled to said circuitry, said circuitry including at least one metal trace formed on the surface of or within the submount, wherein one of the plurality of light emitting diodes and a device disposed on or within the submount are electrically connected by the metal trace;

wherein the plurality of light emitting diodes are attached to the submount by at least one interconnect and wherein at least one of the light emitting diodes in the plurality comprises:
 a top surface and a bottom surface opposite the top surface; and
 first and second contacts electrically connected to first and second semiconductor layers of opposite polarity type, both the first and second contacts being formed on the bottom surface.

2. The light emitting device of claim 1, wherein said shared submount comprises a semiconductor material; and
 at least a portion of said circuitry is formed in said semiconductor material.

3. The light emitting device of claim 2, wherein said semiconductor material comprises silicon.

4. The light emitting device of claim 1, wherein said plurality of light emitting diodes each comprise a substrate.

5. The light emitting device of claim 1, wherein said plurality of light emitting diodes comprise inverted light emitting diodes, said inverted light emitting diodes comprising:
 a substrate, having a side;
 an n-doped semiconductor layer, formed overlying said substrate, having one or more first contact pads;
 an active layer, formed overlying said n-doped layer; and
 a p-doped semiconductor layer, formed overlying said active layer, having one or more second contact pads, wherein said one or more first contact pads and said one or more second contact pads are on said side of said substrate, and where the coupling between said contact pads and said circuitry is solderballs, ultrasonic bonds, eutectic joints, conducting epoxy or conducting paste.

6. The light emitting device of claim 5, wherein said plurality of light emitting diodes comprise inverted Ill-V light emitting diodes, wherein said n-doped semiconductor layer, said active layer, and said p-doped semiconductor layer comprise one or more Group III elements and one or more Group V elements.

7. The light emitting device of claim 1, wherein said plurality of light emitting diodes comprise:
 inverted Light emitting diodes; and
 non-inverted light emitting diodes, wherein said non-inverted light emitting diodes comprise:
  a conducting substrate, coupled to said circuitry;
  an n-doped semiconductor layer, formed overlying said substrate;
  an active layer, formed overlying said n-doped layer;
  a p-doped semiconductor layer, formed overlying said active layer, having a contact pad; and
  a wire bond, coupling said p-doped semiconductor layer and said circuitry.

8. The light emitting device of claim 1, wherein said plurality of light emitting diodes comprise:
 inverted light emitting diodes; and
 non-inverted light emitting diodes, wherein said nun-inverted light emitting diodes comprise:
  a conducting substrate, coupled to said circuitry;
  a p-doped semiconductor layer, formed overlying said substrate;
  an active layer, formed overlying said p-doped layer;
  an n-doped semiconductor layer, formed overlying said active layer, having a contact pad; and
  a wire bond, coupling said n-doped semiconductor layer and said circuitry.

9. The light emitting device of claim 1, wherein said circuitry couples ones of said plurality of light emitting diodes in parallel.

10. The light emitting device of claim 1, wherein said circuitry couples ones of said plurality of light emitting diodes in series.

11. The light emitting device of claim 1, wherein said circuitry couples ones of said plurality of light emitting diodes in a combination of series and parallel.

12. The light emitting device of claim 1, wherein said plurality of light emitting diodes comprise a plurality of same wavelength diodes, wherein said same wavelength diodes are capable of emitting light with the same wavelength.

13. The light emitting device of claim 1, wherein said plurality of light emitting diodes are capable of emitting light with different wavelengths.

14. The light emitting device of claim 1, comprising:
 a first light emitting diode, capable of emitting red light;
 a second light emitting diode, capable of emitting green light; and
 a third light emitting diode, capable of emitting blue light.

15. The light emitting device of claim 1, comprising:
 a first light emitting diode, capable of emitting light of a wavelength of about 420 nanometers; and
 a second light emitting diode, capable of emitting light of wavelength of about 470 nanometers.

16. The light emitting device of claim 1, wherein said circuitry comprises an assembly of switches, formed in said shared submount, coupled to said plurality of light emitting diodes, capable of switching said circuitry between coupling ones of said plurality of light emitting diodes in series and parallel.

17. The light emitting device of claim 1, wherein said plurality of light emitting diodes have polarities and operating voltages, said polarities directed in a shared direction, wherein said circuitry comprises:
 sub-circuitry, coupling ones of said plurality of light emitting diodes in a combination of series and parallel, having an operating voltage; and
 one or more power shunting diodes, having polarities and breakdown voltages, formed on said shared submount, wherein said one or more power shunting diodes are coupled in parallel to said sub-circuitry of said ones of said plurality of light emitting diodes with polarities opposite to said shared polarity of said plurality of light emitting diodes, wherein said breakdown voltage of said one or more power shunting diodes is larger than said operating voltage of said sub-circuitry of said plurality of light emitting diodes.

18. The light emitting device of claim 1, wherein said plurality of light emitting diodes have polarities and operating voltages, said polarities directed in a shared direction, wherein said circuitry comprises:
 sub-circuitry, coupling ones of said plurality of light emitting diodes in a combination of series and parallel, having an operating voltage; and
 a plurality of power shunting diodes, having polarities and breakdown voltages, formed on said shared submount, wherein ones of said plurality of power shunting diodes are coupled serially, wherein said serially coupled ones of said plurality of power shunting diodes are coupled in parallel to said sub-circuitry of said ones of said plurality of light emitting diodes with polarities opposite to said shared polarity of said plurality of light emitting diodes, wherein said breakdown voltage of said serially coupled ones of said plurality of power shunting diodes is larger than said operating voltage of said sub-circuitry of said plurality of light emitting diodes.

19. The light emitting device of claim 1, wherein said plurality of light emitting diodes have operating voltages, wherein said circuitry comprises:

sub-circuitry, coupling ones of said plurality of light emitting diodes in a combination of series and parallel, said sub-circuitry having an operating voltage; and two power shunting diodes, said power shunting diodes having polarities and breakdown voltages, formed on said shared submount, wherein said two power shunting diodes are coupled serially, with polarities opposite to each other, wherein said serially coupled two power shunting diodes are coupled in parallel to said sub-circuitry of said plurality of light omitting diodes, wherein said breakdown voltage of said serially coupled two power shunting diodes is larger than said operating voltage of said sub-circuitry of said plurality of light emitting diodes.

20. The light emitting device of claim 1, wherein said plurality of light emitting diodes have operating voltages; wherein said circuitry comprises:

sub-circuitry, coupling ones of said plurality of light emitting diodes in a combination of series and parallel, said sub-circuitry having an operating voltage; and a plurality of power shunting diodes, forming a plurality of pairs, said power shunting diodes having polarities and breakdown voltages, formed on said shared submount, wherein said power shunting diodes are formed with polarities opposite to each other within said pairs individually, wherein ones of said pairs of said power shunting diodes are coupled serially, wherein said serially coupled ones of said plurality of pairs of power shunting diodes are coupled in parallel to said sub-circuitry of said plurality of light emitting diodes, wherein said breakdown voltage of said serially coupled plurality of pairs of power shunting diodes is larger than said operating voltage of said sub-circuitry of said plurality of light emitting diodes.

21. The light emitting device of claim 1, wherein said plurality of light emitting diodes have polarities and operating voltages, and wherein said circuitry further comprises:

one or more power shunting diodes, having a polarity and a breakdown voltage, formed on said shared submount, wherein at least one of said one or more power shunting diodes is coupled in parallel to at least one of said plurality of light emitting diodes with a polarity opposite to the polarity of said at least one of said plurality of light emitting diodes, wherein said breakdown voltage of said at least one of said one or more power shunting diodes is larger than said operating voltage of said at least one of said plurality of light emitting diodes.

22. The light emitting device of claim 1, wherein said circuitry comprises a plurality of power shunting diodes, forming one or more pairs, said power shunting diodes having polarities and breakdown voltages, formed on said shared submount, wherein said power shunting diodes are formed with polarities opposite to each other within said one or more pairs individually, wherein at least one of said one or more pairs of power shunting diodes are coupled in parallel to at least one of said plurality of light emitting diodes, wherein said breakdown voltage of said at least one of said one or more pairs of power shunting diodes is larger than said operating voltage of said at least one of said plurality of light emitting diodes.

23. The light emitting device of claim 1, wherein said circuitry comprises a logic circuit, formed in said shared submount.

24. The light emitting device of claim 1, wherein said circuitry comprises:

at least one light sensitive device, formed in or on said shared submount for receiving a portion of light, emitted by said plurality of light emitting diodes; and a control circuit, formed in said shared submount, coupled to said at least one light sensitive device and to said plurality of light emitting diodes for controlling current to said plurality of light emitting diodes based on light received by said at least one light sensitive device.

25. The light emitting device of claim 24, wherein said at least one light sensitive device comprises a light sensitive diode.

26. The light emitting device of claim 24, wherein said at least one light sensitive device comprises a light sensitive transistor.

27. The light emitting device of claim 24, wherein said plurality of light emitting diodes have sides, wherein said at least one light sensitive device is formed in or on said shared submount at least partially under said plurality light emitting diodes, for receiving a portion of light emitted from said side of said plurality of light emitting diodes.

28. The light emitting device of claim 24, wherein at least one of said plurality of light emitting diodes is positioned above at least one of said light sensitive devices, wherein said at least one light sensitive device senses only the light emitted by said at least one of said plurality of light emitting diodes positioned above.

29. The light emitting device of claim 1, wherein said circuitry comprises an oscillator circuit, formed in said shared substrate, coupled to said plurality of light emitting diodes.

30. The light emitting device of claim 1 wherein the submount is external to the plurality of light emitting diodes.

31. The light emitting device of claim 1 wherein the interconnect is solder.

32. The light emitting device of claim 4 wherein:

said plurality of light emitting diodes each comprise a plurality of semiconductor layers including a light-emitting layer;

the semiconductor layers are epitaxially grown on the substrate; and the submount and the substrate do not touch.

33. The light emitting device of claim 1 wherein the interconnect comprises gold.

34. The light emitting device of claim 1 wherein the device is another of the plurality of light emitting diodes.

35. The light emitting device of claim 1 wherein the submount comprises AlN.

36. The light emitting device of claim 1 wherein the submount comprises BeO.

* * * * *

UNITED STATES PATENT AND TRADEMARK OFFICE
CERTIFICATE OF CORRECTION

PATENT NO. : 6,885,035 B2
DATED : April 26, 2005
INVENTOR(S) : Jerome C. Bhat, Daniel A. Steigerwald and Reena Khare It is certified that error appears in the above-identified patent and that said Letters Patent is hereby corrected as shown below:

Column 19,
Line 65, cancel "nun-" and substitute -- non- --.

Column 22,
Line 33, between the words "plurality" and "light" please insert -- of --.

Signed and Sealed this

Twenty-third Day of August, 2005

JON W. DUDAS
*Director of the United States Patent and Trademark Office*